(12) United States Patent
Ito

(10) Patent No.: US 9,564,610 B2
(45) Date of Patent: Feb. 7, 2017

(54) ELECTRONIC DEVICE AND METHOD FOR MANUFACTURING SAME

(71) Applicant: Konica Minolta, Inc., Tokyo (JP)

(72) Inventor: Hirohide Ito, Saitama (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/907,121

(22) PCT Filed: Jul. 25, 2014

(86) PCT No.: PCT/JP2014/069768
§ 371 (c)(1),
(2) Date: Jan. 22, 2016

(87) PCT Pub. No.: WO2015/012404
PCT Pub. Date: Jan. 29, 2015

(65) Prior Publication Data
US 2016/0155986 A1    Jun. 2, 2016

(30) Foreign Application Priority Data

Jul. 26, 2013 (JP) ................................. 2013-156146

(51) Int. Cl.
*H01L 23/10* (2006.01)
*H01L 51/52* (2006.01)
(Continued)

(52) U.S. Cl.
CPC ......... *H01L 51/5253* (2013.01); *H01L 51/441* (2013.01); *H01L 51/5203* (2013.01);
(Continued)

(58) Field of Classification Search
CPC ............. H01L 51/5243; H01L 51/5253; H01L 27/3244; H01L 27/288; H01L 21/32137; H01L 27/3227; H01L 51/5246; H01L 31/022475; H01L 31/0224
See application file for complete search history.

(56) References Cited

FOREIGN PATENT DOCUMENTS

JP      2006-89073      *    4/2006
JP      2008056967 A         3/2008
(Continued)

OTHER PUBLICATIONS

T. Suga, et al; Direct bonding of polymer to glass wafers using surface activated bonding . . . ; 2012 3rd IEEE Int. Workshop on low temperature bonding for 3D integration; ISBN: 978-1-4673-0743-7; 3 pages.

(Continued)

*Primary Examiner* — Jasmine Clark
(74) *Attorney, Agent, or Firm* — Lucas & Mercanti, LLP

(57) ABSTRACT

An object of the present invention is to provide an electronic device in which permeation of water content and oxygen from a bonding part is decreased, and which is excellent in stability, and a method for manufacturing the electronic device. The present invention relates to an electronic device including a substrate, an electronic element main body on the substrate, an electrode that is connected to the electronic element main body, a silicon-containing film that coats at least the electrode, and a sealing substrate that is bonded to the substrate via a bonding part that has the silicon-containing film and is disposed on the surrounding of the electronic element main body, to seal the electronic element main body, in which at least one of the substrate and the sealing substrate is a gas barrier film, and the silicon-containing film has a composition represented by the following chemical formula (1): in which x, y and z are respectively atomic ratios of oxygen, nitrogen and carbon to silicon, and satisfy $0 \leq y < 0.3$, $3 < 2x+5y \leq 5$ and $0.01 < z < 1$, or satisfy $0.3 \leq y < 0.7$, $3 < 2x+5y \leq 5$ and $0 \leq z < 1$.

8 Claims, 7 Drawing Sheets

(51) Int. Cl.
*H01L 51/44* (2006.01)
*H01L 51/56* (2006.01)

(52) U.S. Cl.
CPC .......... *H01L 51/5246* (2013.01); *H01L 51/56* (2013.01); *H01L 51/448* (2013.01); *H01L 51/5243* (2013.01); *H01L 2251/303* (2013.01)

(56) References Cited

FOREIGN PATENT DOCUMENTS

JP      2012064378 A    3/2012
JP      2012-148416    *   8/2012

OTHER PUBLICATIONS

International Search Report dated Sep. 30, 2014 for PCT/JP2014/069768 and English translation.

* cited by examiner

ELECTRONIC DEVICE AND METHOD FOR MANUFACTURING SAME

CROSS REFERENCE TO RELATED APPLICATION

This Application is a 371 of PCT/JP2014/069768 filed on Jul. 25, 2014 which, in turn, claimed the priority of Japanese Application No. 2013-156146 filed on Jul. 26, 2013, both applications are incorporated herein by reference.

TECHNICAL FIELD

The present invention relates to an electronic device and a method for manufacturing the electronic device.

BACKGROUND ART

Electronic devices such as organic electroluminescence elements (organic EL elements), organic solar batteries, organic transistors, inorganic electroluminescence elements and inorganic solar batteries (for example, CIGS solar batteries) are susceptible to oxygen and water content that are present in environments of use. Therefore, many sealing methods for protecting electronic devices from oxygen and water content have been suggested, and methods for sealing by using a barrier substrate using a glass or a metal have been put into practical use.

As a method for sealing these substrates, a method of melt-bonding a substrate and a sealing substrate having an electronic element main body mounted thereon can be considered, but this method has not been able to be put into practical use due to the problem of the heat resistance of electronic devices, and the like. Therefore, a sealing method using an adhesive formed of an organic compound is generally used. However, such sealing method using an adhesive has a problem of entering of water content and oxygen from an adhesive part, which is a bonding part.

In response to this, in recent years, as a bonding method for tightly bonding a metal or a metal oxide without using an adhesive or the like, wherein the bonding is conducted at room temperature such that electronic devices are not deteriorated, for example, a method of room-temperature bonding as in Tadatomo Suga, Takashi Matsumae, Yoshiie Matsumoto, Masashi Nakano, "Direct Bonding of Polymer to Glass Wafers using Surface Activated Bonding (SAB) Method at Room Temperature," Proceedings of the 3rd International IEEE Workshop on Low Temperature Bonding for 3D Integration, May 22-Jun. 23, 2012. is known.

SUMMARY OF INVENTION

However, it is said that, in order to conduct room-temperature bonding, surfaces to be bonded should be plane and even, and the required surface smoothness is a surface smoothness such that a center line average surface roughness (Ra) is several nanometers or less. However, in an electronic device, it is necessary to extract signal wires and electrodes out of an electronic element main body so as to drive and control the electronic device, and these require a thickness of 100 nm or more due to problems such as resistance. Therefore, in order to put room-temperature bonding into practical use, solution of the problem of unevenness of signal wires and electrodes has been desired.

In response to these problems, for example, a method of coating an electrode with a resin so as to fill the unevenness of the electrode has been considered. However, this method requires further formation of a gas barrier layer on the resin so as to prevent water content that permeates into the resin, and thus has problems in view of producibility and reliability.

The requirements desired for a material for filling unevenness of an electrode to planarize the electrode are not only a material that can planarize, but also the lower permeability of water content and gases of the material itself. As materials for attaining these, silicon oxide, silicon nitride, aluminum oxide and the like have been formed into films by various film formation methods, and solution of bumps has been considered, but the solution was not able to be attained due to various reasons such as producibility and generation of cracks in the films themselves.

Therefore, an object of the present invention is to provide an electronic device in which permeation of water content and oxygen from a bonding part is decreased, and which is excellent in stability, and a method for manufacturing the electronic device.

The present inventors did intensive studies so as to solve the above-mentioned problems. Consequently, they found that the above-mentioned problems are solved by planarizing the unevenness of an extraction electrode formed on a substrate by using a silicon-containing film having a specific composition, in an electronic device in which an electronic element main body is sealed by using the substrate and a sealing substrate, and completed the present invention.

That is, the above-mentioned object is achieved by the following constitutions.

1. An electronic device including: a substrate, an electronic element main body on the substrate, an electrode that is connected to the electronic element main body, a silicon-containing film that coats at least the electrode, and a sealing substrate that is bonded to the substrate via a bonding part that has the silicon-containing film and is disposed on the surrounding of the electronic element main body, to seal the electronic element main body, wherein at least one of the substrate and the sealing substrate is a gas barrier film, and the silicon-containing film has a composition represented by the following chemical formula (1):

[Chemical Formula 1]

$$SiO_xN_yC_z \quad (1)$$

wherein x, y and z are respectively atomic ratios of oxygen, nitrogen and carbon to silicon, and satisfy $0 \leq y < 0.3$, $3 < 2x+5y \leq 5$ and $0.01 < z < 1$, or satisfy $0.3 \leq y < 0.7$, $3 < 2x+5y \leq 5$ and $0 \leq z < 1$.

2. The electronic device according to the above 1, wherein the silicon-containing film further contains an element M selected from the elements of Group 13 of the Long Format Periodic Table, and has a composition represented by the following chemical formula (2):

[Chemical Formula 2]

$$SiO_xN_yC_zM_w \quad (2)$$

wherein x, y, z and w are respectively atomic ratios of oxygen, nitrogen, carbon and M to silicon, and satisfy $0 \leq y < 0.3$, $3 < 2x+5y \leq 5$, $0.01 < z < 1$ and $0.01 < w < 0.5$.

3. The electronic device according to the above 1 or 2, wherein the silicon-containing film is formed by modifying a layer containing a polysilazane compound.

4. The electronic device according to any one of the above 1 to 3, wherein the silicon-containing film has an elastic modulus of the film measured by the nanoindentation process of from 20 to 40 GPa.

5. A method for manufacturing an electronic device, including: a step of forming an electrode on a substrate, a step of preparing an electronic element main body on the substrate on which the electrode has been formed, a step of coating at least the electrode with a silicon-containing film, a step of forming bonding margins for bonding the substrate and a sealing substrate for sealing the electronic element main body, on at least the silicon-containing film of the substrate, and on the sealing substrate, respectively, and a step of bringing the bonding margins into contact and forming a bonding part by room-temperature bonding, wherein at least one of the substrate and the sealing substrate is a gas barrier film, and the silicon-containing film has a composition represented by the following chemical formula (1):

[Chemical Formula 3]

$$SiO_xN_yC_z \qquad (1)$$

wherein x, y and z are respectively atomic ratios of oxygen, nitrogen and carbon to silicon, and satisfy $0 \leq y < 0.3$, $3 < 2x+5y \leq 5$ and $0.01 < z < 1$, or satisfy $0.3 \leq y < 0.7$, $3 < 2x+5y \leq 5$ and $0 \leq z < 1$.

BRIEF DESCRIPTION OF DRAWINGS

In FIG. 1, reference numeral 10 represents an electronic device, reference numeral 11 represents a substrate, reference numeral 12 represents a sealing substrate, reference numeral 13 represents an electronic element main body, reference numeral 14 represents an electrode (an extraction electrode), reference numeral 15 represents a protective layer, reference numeral 16 represents a bonding part, reference numeral 17 represents a first electrode (an anode), reference numeral 18 represents a hole transport layer, reference numeral 19 represents a light-emitting layer, reference numeral 20 represents an electron transport layer, reference numeral 21 represents a second electrode (a cathode), reference numeral 23 represents a silicon-containing film, and reference numeral 24 represents an intermediate layer.

In FIG. 2, reference numeral 11 represents a substrate, reference numeral 12 represents a sealing substrate, reference numeral 16 represents a bonding part, and reference numeral 13 represents an electronic element main body.

In FIG. 3, reference numeral 1 represents a gas barrier film, reference numeral 2 represents a substrate, reference numeral 3 represents a gas barrier layer, reference numeral 51 represents a plasma CVD device, reference numeral 52 represents a film formation chamber, reference numeral 53 represents an upper electrode, reference numeral 54 represents a lower electrode, reference numeral 55 represents a power source device, reference numerals 56a, 56b and 56c represent film formation gas storage parts, reference numeral 57 represents a tube, reference numeral 58 represents a gas introduction port, reference numeral 59 represents a plasma discharging area, and reference numerals 60a, 60b, 60c and 62 represent valves, and reference numeral 61 represents a vacuum pump.

In FIG. 4, reference numeral 1 represents a gas barrier film, reference numeral 2 represents a substrate, reference numeral 3 represents a gas barrier layer, reference numeral 31 represents a manufacture device, reference numeral 32 represents a sending roller, reference numerals 33, 34, 35 and 36 represent conveying rollers, reference numerals 39 and 40 represent film formation rollers, reference numeral 41 represents a gas feeding tube, reference numeral 42 represents a power source for generating plasma, reference numerals 43 and 44 represent magnetic field-generating devices, and reference numeral 45 represents a winding roller.

In FIG. 5, reference numeral 11 represents a substrate, reference numeral 12 represents a sealing substrate, reference numeral 130 represents a room-temperature bonding device, reference numeral 131 represents a vacuum chamber, reference numeral 132 represents an ion gun (a sputtering source), reference numeral 133 represents a target stage 1, and reference numeral 134 represents a target stage 2.

In FIG. 6, reference numeral 11 represents a substrate, reference numeral 12 represents a sealing substrate, reference numeral 16 represents a bonding part, and reference numeral 127 represents a bonding interface.

In FIG. 7, reference numeral 11 represents a substrate, reference numeral 12 represents a sealing substrate, reference numeral 132 represents a ion gun (a sputtering source), reference numeral 135 represents a target, reference numerals 136a, 136b and 136c represent target substrates, reference numeral 137 represents an incident ray, and reference numeral 138 represents outgoing ray (sputter particles).

DESCRIPTION OF EMBODIMENTS

Figure 1A:
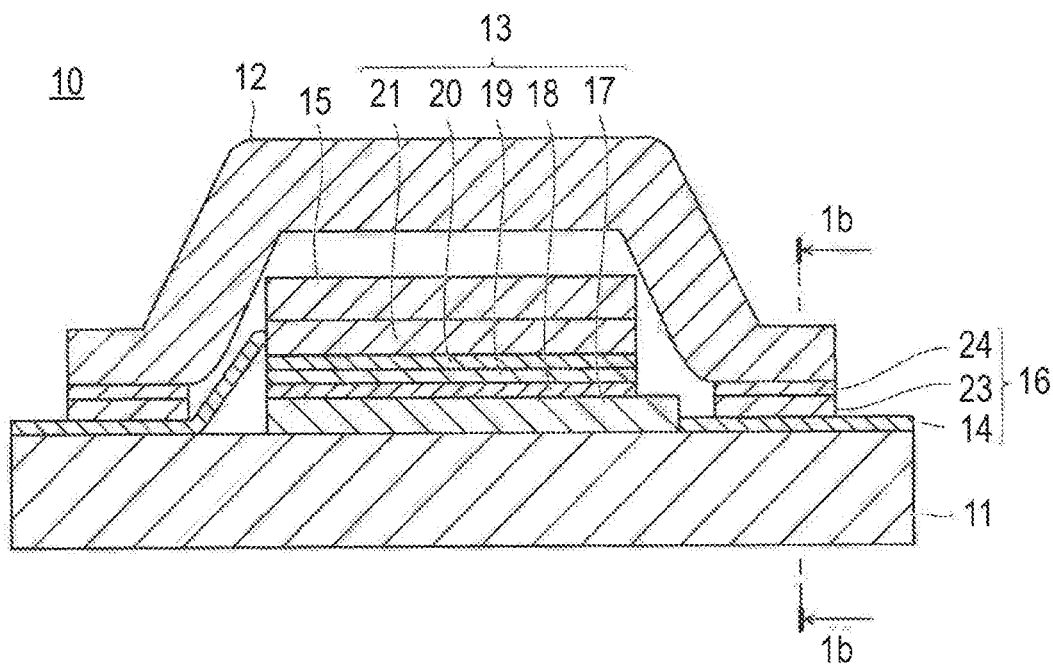
FIG. 1 is a cross-sectional schematic view showing an electronic device according to an exemplary embodiment of the present invention.

According to the present invention, there is provided an electronic device including: a substrate, an electronic element main body on the substrate, an electrode that is connected to the electronic element main body, a silicon-containing film that coats at least the electrode, and a sealing substrate that is bonded to the substrate via a bonding part that has the silicon-containing film and is disposed on the surrounding of the electronic element main body, to seal the electronic element main body, wherein at least one of the substrate and the sealing substrate is a gas barrier film, and the silicon-containing film has a composition represented by the following chemical formula (1):

[Chemical Formula 4]

$$SiO_xN_yC_z \qquad (1)$$

wherein x, y and z are respectively atomic ratios of oxygen, nitrogen and carbon to silicon, and satisfy $0 \leq y < 0.3$, $3 < 2x+5y \leq 5$ and $0.01 < z < 1$, or satisfy $0.3 \leq y < 0.7$, $3 < 2x+5y \leq 5$ and $0 \leq z < 1$.

According to the present invention, an electronic device in which permeation of water content and oxygen from a bonding part is decreased, and which is excellent in stability, and a method for manufacturing the electronic device are provided.

The present invention is characterized in that the unevenness of the surface of a substrate, which is caused by forming an electrode (an extraction electrode) on the substrate, is planarized by being coated with a silicon-containing film having a specific composition, and the substrate and sealing substrate are bonded via a bonding part formed on the planarized surface, and thus the electronic element main body is sealed. In the electronic device having such structure, permeation of water content and oxygen from the bonding part is decreased, and thus the electronic device has excellent stability.

The exemplary embodiments of the present invention will be explained below with referring to the attached drawings. The present invention is not limited to only the following exemplary embodiments. Furthermore, there are some cases when the size ratio in the drawing is exaggerated for convenience of explanation and thus is different from the actual ratio.

The electronic device of the present invention may be, for example, an organic electroluminescence (EL) element. In the following explanation, as a typical exemplary embodiment, the case when the electronic device of the present invention is an organic EL element will be exemplified and explained, but the technical scope of the present invention is not limited to only the following embodiment.

FIG. 1A is a schematic cross-sectional view of an electronic device 10 according to an exemplary embodiment of the present invention. That is, the electronic device 10 shown in FIG. 1 has a substrate 11, a sealing substrate 12, and an electronic element main body 13 that is disposed between the substrate 11 and the sealing substrate 12. At this time, at least one of the substrate and the sealing substrate is a gas barrier film. In this exemplary embodiment, a protective layer 15 is disposed on the upper of the electronic element main body 13 in a state that a part of the electronic element main body 13 is coated. Furthermore, an electrode (an extraction electrode) 14 for controlling the electronic element main body from outside is formed on the substrate 11, and a silicon-containing film 23 is formed on the electrode 14. The electronic element main body 13 is sealed by the bonding of the substrate 11 and the sealing substrate 12 through a bonding part 16. Specifically, the bonding part 16 is formed at the interface between the silicon-containing film 23 on the electrode 14 formed on the substrate 11, and the sealing substrate 12, and the sealing substrate 12 and the substrate 11 are bonded by the bonding part 16. In this exemplary embodiment, an intermediate layer 24 is disposed to between the silicon-containing film 23 on the substrate 11 and the sealing substrate 12 at the bonding part.

Figure 1B:
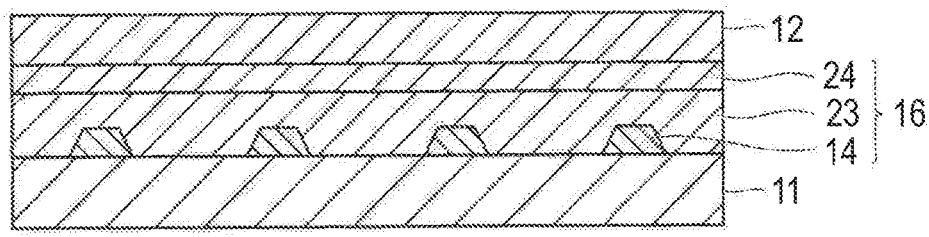

FIG. 1B is a view schematically showing the cross-sectional surface of 1b of FIG. 1A of the bonding part 16. Specifically, by forming the electrode 14 on the substrate 10 and forming the silicon-containing film 23 on the electrode 14, the unevenness on the substrate 11, which is generated by the formation of the electrode 14, can be planarized.

Figure 2:
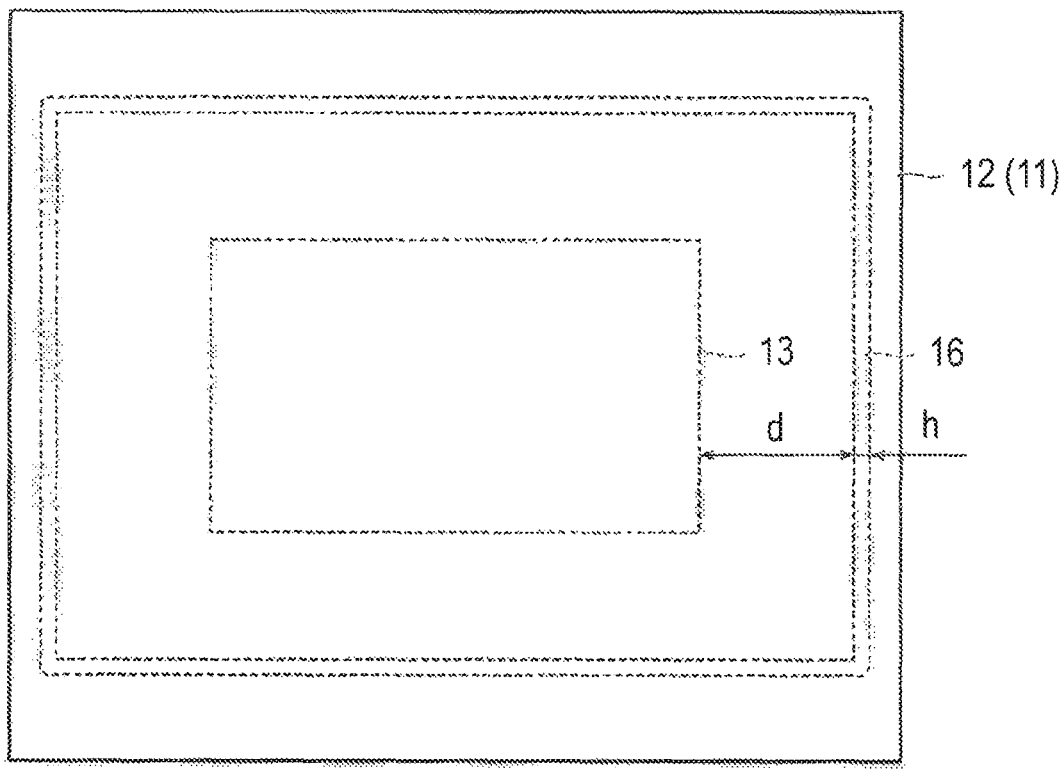
FIG. 2 is a schematic plane view showing an electronic device according to an exemplary embodiment of the present invention.

FIG. 2 is a schematic plane view showing the electronic device 10. The bonding part 16 is present on the surrounding of the electronic element main body 13. As used herein, "surrounding" of the electronic element main body 13 means the surrounding having a width h which is apart from the peripheral edge of the electronic element main body 13 at a predetermined interval d as shown in FIG. 2.

The silicon-containing film used in the electronic device of the present invention has a composition represented by the following chemical formula (1).

[Chemical Formula 5]

$$SiO_xN_yC_z \qquad (1)$$

wherein x, y and z are respectively atomic ratios of oxygen, nitrogen and carbon to silicon, and satisfy $0 \leq y < 0.3$, $3 < 2x+5y \leq 5$ and $0.01 < z < 1$, or satisfy $0.3 \leq y < 0.7$, $3 < 2x+5y \leq 5$ and $0 \leq z < 1$.

By such constitution, the substrate 11 and the sealing substrate 12 are strongly bonded, and the entering of oxygen and water content into the electronic element main body can be prevented, and thus the stability of the electronic device can be improved.

In recent years, in order to further increase the sealing property of the electronic device, application of a room-temperature bonding process that enables a strong bonding by metal bonding or intermolecular bonding at an atomic level without accompanying heating and without using an adhesive is desired in a step of bonding substrates. In recent years, the application of the room-temperature bonding process has been extended to not only metals but also oxide materials and semiconductor materials. However, in order to apply the room-temperature bonding process, it is necessary to prepare very plane surfaces having surface roughnesses of, for example, about several nanometers, in which the surfaces to be bonded do not have adsorption of impurities and the like. In response to this, it is necessary to extract an electrode for driving and controlling of the electronic device main body out of sealing in an actual electronic device, and it is generally deemed that such electrode requires a thickness of at least 100 nm due to problems such as resistance. Therefore, in order to prepare a stable electronic device by suppressing the permeation of water content and oxygen from the bonding part, an electronic device that can form a bonding part by planarizing by filling the unevenness of the electrode, and thus the entering of water content and gases from the bonding part can be prevented, is required.

Although the detail of the reason why the entering of oxygen and water content into the electronic element main body of the electronic device of the present invention can be prevented and thus the stability of the electronic device is improved is unclear, it is considered that the reason is that a silicon-containing film having a specific composition as mentioned above has low permeability of water content and gases, and that the elastic modulus measured by the nanoindentation process is in a specific range. In the case when the elastic modulus is small, the sealing performance is low, whereas in the case when the elastic modulus is large, the adhesive force between the substrate and the sealing substrate is small. In order to decrease the water content and gas transmittance of the silicon-containing film, a dense film having an elastic modulus of a certain degree or more is necessary. However, when the elastic modulus increases, the effect to follow unevenness decreases, and thus it is presumed that the bonding is weaken in room-temperature bonding in which high plainness is required. Therefore, it is considered that, by planarizing with a silicon-containing film having a specific elastic modulus, the substrate 11 and the sealing substrate 12 are tightly bonded by room-temperature bonding without using an adhesive such as a resin, and the entering of oxygen and water content into the electronic element main body 13 can be prevented.

The present invention is not limited by the above-mentioned mechanism at all.

In the exemplary embodiment shown in the above-mentioned FIG. 1, the electronic element main body 13 is an organic EL element main body, and is formed by sequentially stacking a first electrode (anode) 17, a hole transport layer 18, a light-emitting layer 19, an electron transport layer 20, and a second electrode (cathode) 21.

In the form shown in FIG. 1, the electronic device 10 is formed by sequentially stacking, on the substrate 11, the electronic element main body 13, and a protective layer 15 as necessary, and the sealing substrate 12. However, the electronic device 10 may also have a constitution in which the electronic element main body 13, and the protective layer 15 as necessary, and the substrate 11 are stacked in this order on the sealing substrate 12.

Hereinafter the members constituting the electronic device of the present exemplary embodiment will be explained in detail.

The electronic device 10 may further have other layer in addition to the substrate 11, the sealing substrate 12, the electronic element main body 13, the electrode 14, the protective layer 15, the silicon-containing film 23 and the intermediate layer 24, which are explained above. The other layers are not specifically limited, and examples include a stabilizing layer for stabilizing the electrode and electronic element main body, a gas absorbing layer and the like.

The embodiments for carrying out the present invention will be explained in detail, but the present invention is not limited to these.

[Substrate]

The substrate according to the present invention is not specifically limited. Examples include glass substrates, metal foils, gas barrier films each having a substrate and a gas barrier layer, and the like.

In the present invention, from the viewpoint of ensuring of gas barrier property and flexibility, it is necessary that at least one of the substrate and the sealing substrate is a gas barrier film. It is preferable that the sealing substrate is a gas barrier film, and it is more preferable that both of the substrate and the sealing substrate are gas barrier films.

The substrate according to the present invention has a water vapor permeation degree at 40° C. and 90% RH of preferably $5\times10^{-3}$ g/m$^2$·day or less, more preferably $5\times10^{-4}$ g/m$^2$·day or less, further preferably $5\times10^{-5}$ g/m$^2$·day or less.

Examples of the glass substrate include quartz glass substrates, borosilicate glass substrates, soda glass substrates, alkali-free glass substrates and the like. The metal foils include metal foils of aluminum (Al), gold (Au), silver (Ag), chromium (Cr), iron (Fe), nickel (Ni), cobalt (Co), copper (Cu), indium (In), tin (Sn), lead (Pb), titanium (Ti) and alloys thereof, and the like.

Furthermore, the gas barrier film that is preferably used as the substrate will be explained below.

<Substrate>

The substrate may be a long substrate. The substrate can retain a gas barrier layer having a gas barrier property (simply referred to as "barrier property") mentioned below, and is formed by the materials as mentioned below, but the materials are not specifically limited to these.

Examples of the substrate can include films of respective resins such as polyacrylic acid esters, polymethacrylic acid esters, polyethylene telephthalate (PET), polybutylene telephthalate, polyethylene naphthalate (PEN), polycarbonates (PC), polyarylates, polyvinyl chloride (PVC), polyethylene (PE), polypropylene (PP), cycloolefin polymers (COP), cycloolefin copolymers (COC), cellulose triacetate (TAC), styrenes (PS), nylons (Ny), aromatic polyamides, polyether ether ketones, polysulfones, polyethersulfones, polyimides and polyetherimides, heat-resistant transparent films having silsesquioxane having an organic-inorganic hybrid structure as a basic backbone (product name: Sila-DEC; manufactured by Chisso Corporation, and Silplus (registered trademark); manufactured by Nippon Steel Chemical Co., Ltd.), and resin films constituted by stacking two or more of the above-mentioned resins, and the like.

In view of cost and availability, polyethylene telephthalate (PET), polybutylene telephthalate, polyethylene naphthalate (PEN), polycarbonates (PC) and the like are preferably used, and TAC, COC, COP, PC and the like which are manufactured by a cast process due to their optical transparency and small birefringence are preferably used, and in view of optical transparency, heat-resistance, and tight-adhesiveness with the gas barrier layer, heat-resistant transparent films having a silsesquioxane having an organic-inorganic hybrid structure as a basic backbone are preferably used.

The thickness of the substrate is preferably about from 5 to 500 µm, more preferably from 25 to 250 µm.

Furthermore, the substrate is preferably transparent. That the substrate is transparent as used herein represents that the light transmittance of visible light (400 to 700 nm) is 80% or more.

This is because the substrate is transparent and the gas barrier layer formed on the substrate is also transparent, and thus it is possible to form a transparent gas barrier film, and it is also possible to form a transparent substrate of an organic EL element and the like.

Furthermore, the substrate using the resins and the like listed above may be either unstretched films or stretched films.

Furthermore, in the substrate according to the present invention, the surface of the substrate may be subjected to a corona treatment before forming a gas barrier layer.

The surface roughness of the substrate used in the present invention is such that a ten-point average roughness Rz defined in JIS B0601: 2001 is preferably in the range of from 1 to 500 nm, more preferably in the range of from 5 to 400 nm, further preferably in the range of from 300 to 350 nm.

Furthermore, the center line average surface roughness (Ra) defined by JIS B0601: 2001 on the substrate surface is preferably in the range of from 0.5 to 12 nm, more preferably in the range of from 1 to 8 nm.

<Gas Barrier Layer>

The material for the gas barrier layer (also simply referred to as "barrier layer") used in the present invention is not specifically limited, and various inorganic barrier materials can be used. Examples of the inorganic barrier materials include, for example, single bodies of at least one kind of metals selected from the group consisting of silicon (Si), aluminum (Al), indium (In), tin (Sn), zinc (Zn), titanium (Ti), copper (Cu), cerium (Ce) and tantalum (Ta), and metal compounds such as oxides, nitrides, carbides, acid nitrides or oxide carbides and the like of the above-mentioned metals.

More specific examples of the above-mentioned metal compounds include inorganic barrier materials such as metal oxides, metal nitrides, metal carbides, metal oxynitrides and metal oxyborates such as silicon oxide, aluminum oxide, titanium oxide, indium oxide, tin oxide, indium tin oxide (ITO), tantalum oxide, zirconium oxide, niobium oxide, aluminum silicate (SiAlO$_x$), boron carbide, tungsten oxide, silicon oxide, oxygen-containing silicon oxide, aluminum nitride, silicon nitride, boron nitride, aluminum oxynitride, silicon oxynitride, boron oxynitride, zirconium oxyborate, titanium oxyborate, and composites thereof, diamond-like carbon (DLC), and combinations thereof. Indium tin oxide (ITO), silicon oxide, aluminum oxide, aluminum silicate (SiAlO$_x$), silicon nitride, silicon oxynitride, silicon oxycarbide, silicon oxide nitride carbide and combinations thereof are specifically preferable inorganic barrier materials. ITO is an example of a specific member of a ceramic material that can be electroconductive by suitably selecting the respective elemental components.

The method for forming the gas barrier layer is not specifically limited, and examples include sputtering processes (for example, magnetron cathode sputtering, flat plate magnetron sputtering, bipolar AC flat plate magnetron sputtering, bipolar AC rotation magnetron sputtering and the like), deposition processes (for example, resistance heating deposition, electron beam deposition, ion beam deposition, plasma aid deposition and the like), chemical deposition processes such as a thermal CVD process, a catalyst chemical vapor deposition process (Cat-CVD), a capacity bond plasma CVD process (CCP-CVD), a light CVD process, a plasma CVD process (PE-CVD), an epitaxial growth process, an atomic layer growing process and a reactive sputtering process, and the like.

Furthermore, the above-mentioned gas barrier layer may also contain an organic layer containing an organic polymer. That is, the gas barrier layer may be a stacked body of the inorganic layer containing the above-mentioned inorganic barrier material and the organic layer.

The organic layer can be formed by, for example, applying an organic monomer or an organic oligomer onto the substrate to form a layer, and then conducting polymerization by using an electron beam device, a UV light source, a discharging device, or other preferable device, and conducting crosslinking as necessary. Furthermore, for example, the organic layer can also be formed by depositing an organic monomer or an organic oligomer that can be flash-vaporized and crosslinked by radiation, and forming a polymer from the organic monomer or the organic oligomer. The coating efficiency can be improved by cooling the substrate. Examples of the method for applying the organic monomer or organic oligomer include roll coating (for example, gravure roll coating), spray coating (for example, electrostatic spray coating) and the like. Furthermore, examples of the stacking body of the inorganic layer and the organic layer include the stacking bodies described in WO 2012/003198 A and WO 2011/013341 A.

In the case of a stacked body of an inorganic layer and an organic layer, the thicknesses of the respective layers may be the same or different. The thickness of the inorganic layer is preferably from 3 to 1,000 nm, more preferably from 10 to 300 nm. The thickness of the organic layer is preferably from 100 nm to 100 μm, more preferably from 1 μm to 50 μm.

Furthermore, the gas barrier layer is also formed by a method of forming a gas barrier layer by wet-coating an application liquid containing an inorganic precursor such as polysilazane and tetraethyl orthosilicate (TEOS) on a substrate, and then conducting a modification treatment by irradiating with vacuum ultraviolet light, a film metalation technique such as metal plating on a resin substrate, bonding of a metal foil and a resin substrate or the like, or the like.

From the viewpoint of obtaining a high gas barrier property and the effect of the present invention more effectively, it is preferable that the above-mentioned gas barrier layer is formed by a modification treatment of a layer containing a polysilazane, or is a stacked body of an inorganic layer and an organic layer.

The above-mentioned gas barrier layer may be a single layer, or may be a stacked structure of two or more layers. In the case of a stacked structure of two or more layers, the materials of the respective layers may be the same or different.

Furthermore, the gas barrier layer formed by a plasma CVD process shown in FIG. 3, or the gas barrier layer formed by application mentioned below may be the silicon-containing film according to the present invention. In this case, another silicon-containing film may be formed, or it is not necessary to form another silicon-containing film.

The gas barrier layer formed by a plasma CVD process will be explained in detail.

Figure 3:
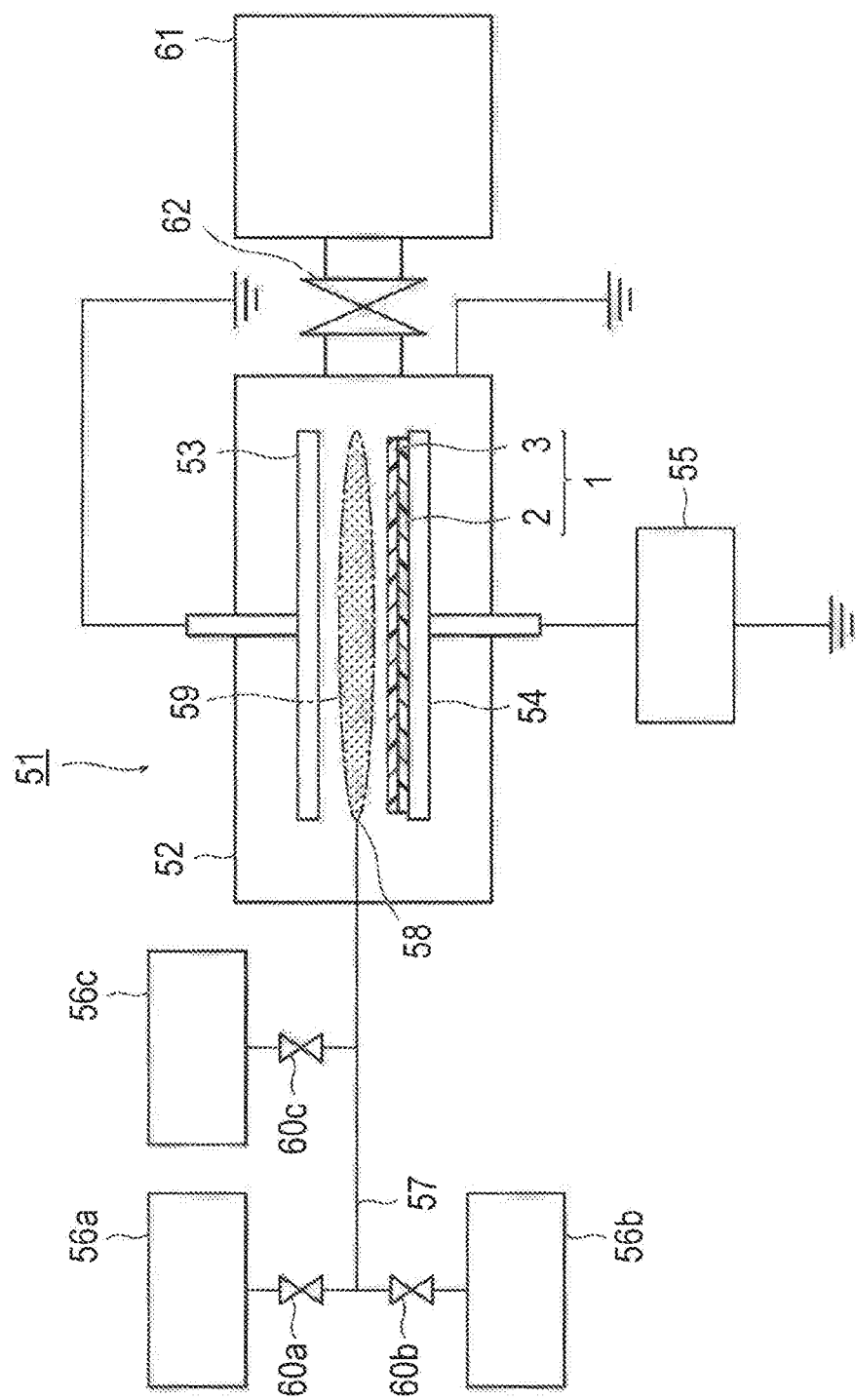
FIG. 3 is a diagram showing an example of a CVD device that can be preferably utilized for preparing a gas barrier film.

FIG. 3 is a schematic view that schematically shows an embodiment of a CVD device that can be utilized for preparing a gas barrier layer.

The constitution of a plasma CVD device 51 shown in FIG. 3 is such that a film formation chamber 52 for film formation by plasma CVD discharging is disposed. In this chamber 52, an upper electrode 53 and a lower electrode 54 are disposed on opposing positions. Furthermore, the lower electrode 54 is connected to a power source device 55 for applying a predetermined electrical power (for example, an input electrical power: 300 W) having a predetermined wave frequency number (for example, 90 kHz). By applying the electrical power by the power source device 55, plasma discharging can be generated in the gap between the upper electrode 53 and the lower electrode 54. In addition, as shown in FIG. 3, either of the chamber 52, the upper electrode 53 and the power source device 55 is grounded.

Furthermore, respective film formation gas storage parts 56a, 56b and 56c are provided to the plasma CVD device 51. In addition, these respective film formation gas storage parts 56a to 56c are connected by a pipe 57 to a gas introduction port 58 that is provided in the vicinity of the electrode. By such constitution, a mixed gas in which respective film formation gases have been adjusted to a desired composition (component concentrations) is fed to the gap between the upper electrode 53 and the lower electrode 54 in the chamber 52 from the gas introduction port 58 through the pipe 57 from the respective film formation gas storage parts 56a, 56b and 56c, whereby a plasma discharging area 59 can be formed. At this time, film formation of a desired gas barrier layer 3 (a carbon-containing silicon oxide film) as a deposition film on a substrate 2 is conducted by attaching the substrate 2 to the side of the lower electrode 54, whereby a gas barrier film 1 can be formed.

Furthermore, valves 60a, 60b and 60c each having an opening and closing mechanism for feeding and stopping of each film formation gas and an adjusting mechanism for adjusting the flow amount (flow rate) of each film formation gas are disclosed on the pipe 57 from the respective film formation gas storage parts 56a to 56c to the gas introduction port 58.

Furthermore, a vacuum pump (for example, an oil rotation pump, a turbo molecular pump or the like) 61 for retaining a reduced-pressure (vacuum) state in the chamber 52 at a level that is necessary for conducting plasma CVD, while feeding film formation gases (for example, an organic silicon compound gas (a raw material gas) such as HMDSO gas), a reaction gas such as oxygen gas and a carrier gas such as helium gas. A valve 62 is provided to between this vacuum pump 61 and the chamber 52. By controlling the degree of opening and closing of the valve 62, and by further controlling the degrees of opening and closing of the valves 60a, 60b and 60c, and the degree of application of the electrical power by the power source device 55, the pressure (vacuum degree) in the chamber 52, the gas composition (the flow amounts or the ratio of flow amounts of the organic silicon compound gas and the oxygen gas), and the plasma discharging amount (the magnitude of the input electrical power per a unit flow amount of the organic silicon compound gas) are adjusted within predetermined ranges, whereby film formation of a desired gas barrier layer 3 as a deposition film can be conducted on the substrate 2 to form the gas barrier film 1.

As preferable embodiments of the above-mentioned method for forming gas barrier layer(s) by a plasma CVD process on one surface (or both surfaces) of the substrate by using the plasma CVD device 51 shown in FIG. 3, and of the film formation gas, the embodiments disclosed in paragraphs "0063" to "0071" and "0077" to "0083" of JP 2014-100806 A can be suitably referred to.

As mentioned above, the atomic ratio of the silicon, oxygen and carbon in the composition of the gas barrier layer 3 can be controlled by adjusting the kinds of the raw material gases and the flow amounts (or the flow amount ratio) of the organic silicon compound gas and oxygen gas as the raw material gases.

Furthermore, in the above-mentioned gas barrier layer, it is preferable to form the above-mentioned gas barrier layer by a roll-to-roll system on the surface of above-mentioned substrate in view of producibility. Furthermore, the device that can be used in manufacturing the gas barrier layer by such plasma CVD process is not specifically limited, and is preferably a device including at least a pair of film formation rollers and a plasma power source, and being capable of discharging between the above-mentioned pair of film formation rollers. For example, in the case when the manufacture device shown in FIG. 4 is used, it is also possible to manufacture by a roll-to-roll system with utilizing a plasma CVD process.

The method for forming the gas barrier layer by a plasma CVD process will be explained in more detail with referring to FIG. 4. FIG. 4 is a schematic view showing an example of a manufacture device that can be preferably used for manufacturing the gas barrier layer. Furthermore, in the following explanations and drawings, an identical symbol will be provided to identical or corresponding elements, and overlapping explanations will be omitted.

Figure 4:
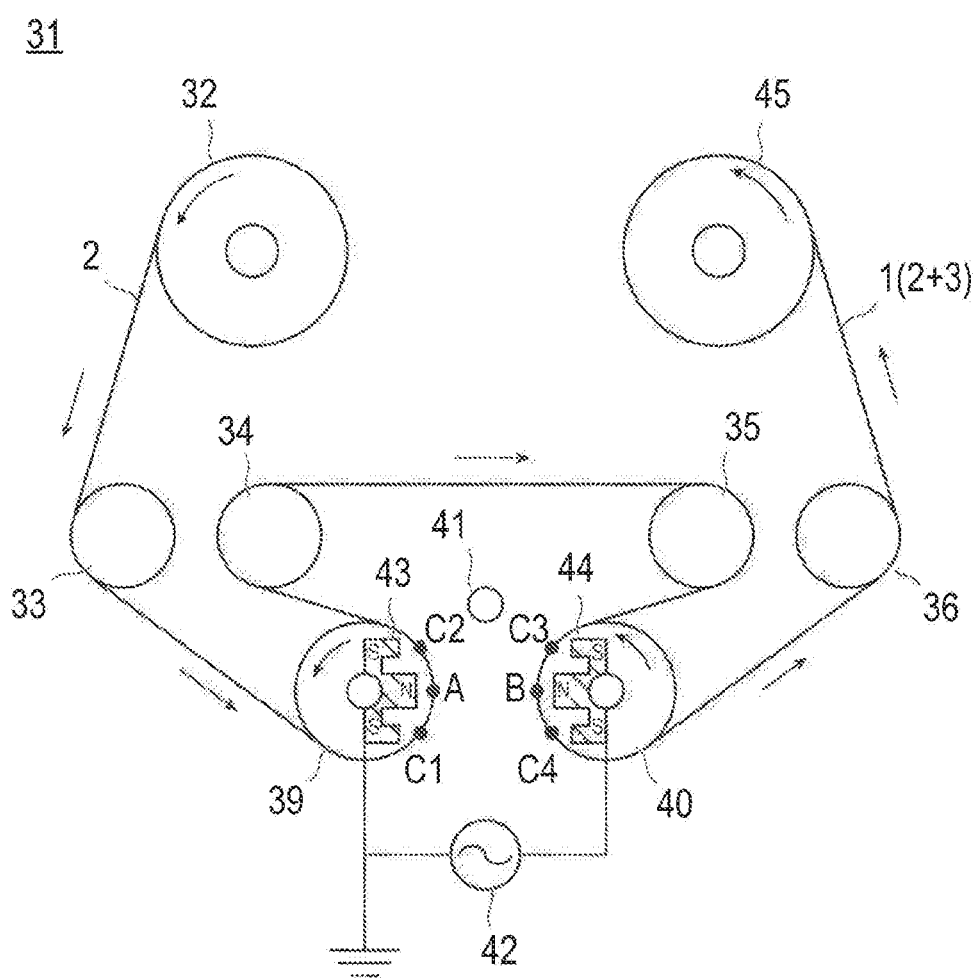
FIG. 4 is a diagram showing an example of a CVD device that can be preferably utilized for preparing a gas barrier film.

A manufacture device 31 shown in FIG. 4 includes a sending roller 32, conveying rollers 33, 34, 35 and 36, film formation rollers 39 and 40, a gas feeding tube 41, a power source for generating plasma 42, magnetic field generating devices 43 and 44 that are disposed in the film formation rollers 39 and 40, and a winding roller 45. Furthermore, in such manufacture device, at least the film formation rollers 39 and 40, the gas feeding tube 41, the power source for generating plasma 42, and the magnetic field generating devices 43 and 44 are disposed in a vacuum chamber, for which illustration is omitted. Furthermore, in such manufacture device 31, the above-mentioned vacuum chamber is connected to a vacuum pump, for which illustration is omitted, and the pressure in the vacuum chamber can be suitably adjusted by such vacuum pump.

Specific embodiments of such manufacture device conform to the embodiments described in paragraphs "0053", "0054" and "0056" of JP 2010-260347 A.

In the magnetic field generating devices 43 and 44 that are respectively provided to the film formation roller 39 and the film formation roller 40, it is preferable to dispose magnetic poles so that magnetic field lines do not straddle between the magnetic field generating device 43 disposed on one film formation roller 39 and the magnetic field generating device 44 disposed on other film formation roller 40, and that the respective magnetic field generating devices 43 and 44 form a magnetic circuit that is approximately closed. Provision of such magnetic field generating devices 43 and 44 is excellent in that the formation of an magnetic field with expanded magnetic force lines can be promoted in the vicinity of the opposed surfaces of the respective film formation rollers 39 and 40, and plasma is easily unspread at the expanded part, and thus the film formation efficiency can be improved.

Furthermore, the magnetic field generating devices 43 and 44 that are respectively disposed on the film formation roller 39 and the film formation roller 40 each includes a long racetruck-like magnetic pole in the roller axis direction, and it is preferable to dispose magnetic poles so that opposing magnetic poles have identical polarity in one magnetic field generating device 43 and other magnetic field generating device 44. It is excellent to dispose such magnetic field generating devices 43 and 44 since a racetruck-like magnetic field can be easily formed in the vicinity of the roller surface that faces an opposed space (a discharging area) along the longitudinal direction of the roller device axis, without straddling of magnetic force lines on the magnetic field generating device at the side of the opposed roller, for the respective magnetic field generating devices 43 and 44, and plasma can be unspread in the magnetic field, and thus the gas barrier layer 3, which is a deposited film, can be efficiently formed by using a wide substrate 2 that is wound along the roller width direction.

As the film formation roller 39 and the film formation roller 40, known rollers can be suitably used. As such film formation rollers 39 and 40, it is preferable to use film formation rollers having an identical diameter, from the viewpoint of more efficient formation of a thin film. Furthermore, as the diameter for such film formation rollers 39 and 40, the diameter is in the range from 300 to 1,000 mmϕ, specifically preferably in the range from 300 to 700 mmϕ, in view of the discharging conditions, the space of the chamber, and the like. If the diameter of the film formation roller is 300 mmϕ or more, it is preferable since the plasma discharging space is not decreased, and thus the producibility is not deteriorated, and the application of the whole amount of heat of the plasma discharging to the substrate 2 within a short time can be avoided and the damage on the substrate 2 can be alleviated. On the other hand, if the diameter of the film formation roller is 1,000 mmϕ or less, it is preferable since practical usefulness in the designing of the device including evenness of the plasma discharging space can be retained.

As the sending roller 32 and conveying rollers 33, 34, 35 and 36 used in such manufacture device, known rollers can be suitably used. Furthermore, the winding roller 45 may be any one that can wind the gas barrier film 1 in which the gas barrier layer 3 has been formed on the substrate 2 and is not specifically limited, and a known roller can be suitably used.

Furthermore, as the gas feeding tube 41 and the vacuum pump, those which can feed or eject the raw material gases and the like at a predetermined velocity can be suitably used.

Furthermore, the gas feeding tube 41 as a gas feeding means is preferably provided to one side of the opposing space (discharging area; film formation zone) between the film formation roller 39 and the film formation roller 40, and a vacuum pump as a vacuum gas exhausting means (not illustrated) is preferably disposed on the other side of the above-mentioned opposing space. Disposing the gas feeding tube 41 as a gas feeding means and the vacuum pump as a vacuum gas exhausting means in such way is excellent in that the film formation gases can be fed to the opposed space between the film formation roller 39 and the film formation roller 40 efficiently, and thus the film formation efficiency can be improved.

Furthermore, as the power source for generating plasma 42, a known power source for a plasma generating device can be suitably used. As such power source for generating plasma 42 and applied electrical power, the embodiment in paragraph "0061" of JP 2012-096531 A can be adopted. Furthermore, as the magnetic field generating devices 43 and 44, known magnetic field generating devices can be suitably used. Furthermore, as the substrate 2, besides the substrates used in the present invention, a substrate on which the gas barrier layer 3 has been formed in advance can be used. By using the substrate 2 on which the gas barrier layer 3 has been formed in advance in such way, it is also possible to thicken the thickness of the gas barrier layer 3.

Using such manufacture device 31 shown in FIG. 4, for example, the gas barrier layer can be manufactured by suitably adjusting the kinds of the raw material gases, the electrical power of the electrode drum in the plasma generating device, the pressure in the vacuum chamber, the diameter of the film formation roller, and the conveying velocity of the film (substrate). Specifically, by generating discharging between a pair of film formation rollers (the film formation rollers 39 and 40) while feeding film formation gases (raw material gases and the like) into the vacuum chamber by using the manufacture device 31 shown in FIG. 4, the above-mentioned film formation gases (raw material gases and the like) are decomposed by plasma, and the gas barrier layer 3 is formed on the surface of the substrate 2 on the film formation roller 39 and the surface of the substrate 2 on the film formation roller 40 by a plasma CVD process. At this time, a racetruck-like magnetic field is formed in the vicinity of the roller surface facing the opposing space (discharging area) along the longitudinal direction of the roller axis of the film formation rollers 39 and 40, whereby plasma is unspread in the magnetic field. Therefore, when the substrate 2 passes through the position A on the film formation roller 39 and the position B on the film formation roller 40 in FIG. 4, the local maximal values of a carbon distribution curve are formed on the gas barrier layer. In response to this, when the substrate 2 passes through the positions C1 and C2 on the film formation roller 39 and the positions C3 and C4 on the film formation roller 40 in FIG. 4, the local minimal values of the carbon distribution curve are formed on the gas barrier layer.

As the film formation gas (raw material gases and the like) fed from the above-mentioned gas feeding tube 41 to the opposed space, raw material gases, reaction gases, carrier gases and discharging gases can be used singly or by mixing two or more kinds. The raw material gases in the above-mentioned film formation gas for use in the formation of the barrier layer 3 can be suitably selected and used depending on the material of the barrier layer 3 to be formed. As such raw material gases, for example, organic compound gases containing organic silicon compounds containing silicon and carbon can be used. Examples of such organic silicon compounds include hexamethyldisiloxane (HMDSO), hexamethyldisilane (HMDS), 1,1,3,3-tetramethyldisiloxane, vinyltrimethylsilane, methyltrimethylsilane, hexamethyldisilane, silane, methylsilane, dimethylsilane, trimethylsilane, diethylsilane, propylsilane, phenylsilane, vinyltriethoxysilane, vinyltrimethoxysilane, tetramethoxysilane (TMOS), tetraethoxysilane (TEOS), phenyltrimethoxysilane, methyltriethoxysilane and octamethylcyclotetrasiloxane. Among these organic silicon compounds, hexamethyldisiloxane and 1,1,3,3-tetramethyldisiloxane are preferable in view of properties such as the handling property of the compound and the gas barrier property of the obtained barrier layer. These organic silicon compounds can be used singly or by combining two or more kinds. Furthermore, as the organic compound gases containing carbon, for example, methane, ethane, ethylene and acetylene can be exemplified. For these organic silicon compound gases and organic compound gases, suitable raw material gases are selected depending on the kind of the gas barrier layer 3.

Furthermore, as the above-mentioned film formation gas, a reaction gas may also be used besides the above-mentioned raw material gases. As such reaction gas, a gas that reacts with the above-mentioned raw material gas to form an inorganic compound such as an oxide or a nitride can be suitably selected and used. As the reaction gas for forming an oxide, for example, oxygen and ozone can be used. Furthermore, as the reaction gas for forming a nitride, for example, nitrogen and ammonia can be used. These reaction gases can be used singly or by combining two or more kinds, and for example, in the case when an acid nitride is to be formed, a reaction gas for forming an oxide and a reaction gas for forming a nitride can be used in combination.

As the above-mentioned film formation gas, where necessary, a carrier gas may be used for feeding the above-mentioned raw material gases into the vacuum chamber. Furthermore, as the above-mentioned film formation gas, where necessary, a discharging gas may also be used so as to generate plasma discharging. As such carrier gas and discharging gas, known ones can be suitably used, and for example, rare gases such as helium, argon, neon and xenon; and hydrogen can be used.

In the manufacture of the gas barrier layer using the device of the above-mentioned FIG. 3 or FIG. 4, as the preferable ratio of the raw material gas and the reaction gas in the film formation gas, and the like, the embodiments described in paragraphs "0066" to "0068" of JP 2012-096531 A can be referred to.

Furthermore, the pressure (vacuum degree) in the vacuum chamber can be suitably adjusted depending on the kind of the raw material gas, and the like, and is preferably set to be in the range from 0.5 Pa to 50 Pa.

Furthermore, in such plasma CVD process, in order to discharge between the film formation roller 39 and the film formation roller 40, the electrical power applied to the electrode drum (disposed in the film formation rollers 39 and 40 in the present exemplary embodiment) connected to the power source for generating plasma 42 can be suitably adjusted depending on the kinds of the raw material gases, the pressure in the vacuum chamber, and the like, and thus cannot be generally said, and for example, the applied electrical power described in paragraph "0070" of JP 2012-096531 A can be adopted.

The conveying velocity (line velocity) of the substrate 2 can be suitably adjusted depending on the kinds of the raw material gases, the pressure in the vacuum chamber, and the like, and is preferably set to be within the range from 0.25 to 100 m/min, more preferably set to be within the range from 0.5 to 20 m/min. If the line velocity is 0.25 m/min or more, generation of wrinkles caused by heat on the substrate can be effectively suppressed. On the other hand, the line velocity is excellent when it is 100 m/min or less, since a sufficient thickness as a gas barrier layer can be ensured without deteriorating producibility.

As mentioned above, a more preferable aspect of the present exemplary embodiment is characterized in that the gas barrier layer is formed by film formation by a plasma CVD process using the plasma CVD device having opposed roll electrodes (a roll-to-roll system) shown in FIG. 4. This is because, in the case of mass manufacture by using a plasma CVD device having opposed roll electrodes (a roll-to-roll system), a gas barrier layer that is excellent in flexibility (bendability), and simultaneously attains mechanical strength, specifically durability during conveying by roll-to-roll, and barrier conductance can be efficiently manufactured. Such manufacture device is also excellent in that a gas barrier film for which durability against temperature change is required, which is used in solar batteries, electronic parts and the like, can be mass-produced in an expensive and easy manner.

Secondly, the gas barrier layer formed by a modification treatment of a layer containing a polysilazane will be explained in detail.

(Polysilazane)

In the present invention, the polysilazane used for the formation of the gas barrier layer is a polymer having silicon-nitrogen bonds, and is a ceramic precursor inorganic polymer of $SiO_2$ and $Si_3N_4$, which have bonds such as Si—N, Si—H and N—H, and an intermediate solid-solution of both, $SiO_xN_y$, or the like. In this specification, "polysilazane compound" is also abbreviated as "polysilazane".

[Chemical Formula 6]

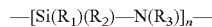

—[Si(R$_1$)(R$_2$)—N(R$_3$)]$_n$—    General formula (I):

In the above-mentioned general formula (I), $R_1$, $R_2$ and $R_3$ are each independently a hydrogen atom, or a substituted or unsubstituted alkyl group, aryl group, vinyl group or (trialkoxysilyl)alkyl group. At this time, $R_1$, $R_2$ and $R_3$ may be the same or different from one another. Examples of the alkyl group include straight chain, branched chain or cyclic alkyl groups having a carbon atom number of from 1 to 8. More specific examples include a methyl group, an ethyl group, an n-propyl group, an isopropyl group, an n-butyl group, an isobutyl group, a sec-butyl group, a tert-butyl group, an n-pentyl group, an isopentyl group, a neopentyl group, an n-hexyl group, an n-heptyl group, an n-octyl group, a 2-ethylhexyl group, a cyclopropyl group, a cyclopentyl group, a cyclohexyl group and the like. Furthermore, examples of the aryl group include aryl groups having a carbon atom number of from 6 to 30. More specific examples include non-condensed hydrocarbon groups such as a phenyl group, a biphenyl group, a terphenyl group; and condensed polycyclic hydrocarbon groups such as a pentalenyl group, an indenyl group, a naphthyl group, an azulenyl group, a heptalenyl group, a biphenylenyl group, a fluorenyl group, an acenaphthylenenyl group, a preadenyl group, an acenaphthenyl group, a phenalenyl group, a phenanthryl group, an anthryl group, a fluoranetenyl group, an acephenanethrylenyl group, an aceantrilenyl group, a triphenylenyl group, a pyrenyl group, a crycenyl group, a naphthacenyl group and the like. Examples of the (trialkoxysilyl)alkyl group include alkyl groups having a carbon atom number of from 1 to 8 and having a silyl group substituted with an alkoxy group having a carbon atom number of from 1 to 8. More specific examples include a 3-(triethoxysilyl)propyl group, a 3-(trimethoxysilyl)propyl group and the like. The substituents that are optionally present in the above-mentioned $R_1$ to $R_3$ are not specifically limited, and examples include alkyl groups, halogen atoms, a hydroxy group (—OH), a mercapto group (—SH), a cyano group (—CN), a sulfo group (—SO$_3$H), a carboxy group (—COOH), a nitro group (—NO$_2$) and the like. The substituents that are optionally present are not the same as $R_1$ to $R_3$ that are substituted. For example, in the case when $R_1$ to $R_3$ are alkyl groups, $R_1$ to $R_3$ are not further substituted with an alkyl group. Among these, $R_1$, $R_2$ and $R_3$ are preferably a hydrogen atom, a methyl group, an ethyl group, a propyl group, an isopropyl group, a butyl group, an isobutyl group, a tert-butyl group, a phenyl group, a vinyl group, a 3-(triethoxysilyl)propyl group or a 3-(trimethoxysilylpropyl) group.

Furthermore, in the above-mentioned general formula (I), n is an integer that represents the number of the constitutional unit of the formula: —[Si(R$_1$)(R$_2$)—N(R$_3$)]—, and is preferably defined so that the polysilazane compound having a structure represented by the general formula (I) has a number average molecular weight of from 150 to 150,000 g/mol.

In the present invention, in view of the denseness of the obtained gas barrier layer as a film, perhydropolysilazane (PHPS) in which all of $R_1$, $R_2$ and $R_3$ are hydrogen atoms is specifically preferable.

The structure of the perhydropolysilazane is presumed to be a structure in which straight chain structures and ring structures mainly having 6 and 8-membered rings are present. The perhydropolysilazane has a molecular weight of about 600 to 2,000 (polystyrene conversion) by a number average molecular weight (Mn), is a liquid or solid substance, and differs depending on the molecular weight.

The polysilazane is commercially available in the state of a solution dissolved in an organic solvent, and a commercially available product can be directly used as an application liquid for forming polysilazane layer. Examples of the commercially available products of the polysilazane solution include NN120-10, NN120-20, NAX120-20, NN110, NN310, NN320, NL110A, NL120A, NL120-20, NL150A, NP110, NP140 and SP140 manufactured by AZ Electronic Materials, and the like.

The solvent for preparing the application liquid containing the polysilazane (hereinafter also simply referred to as a polysilazane-containing application liquid) is not specifically limited as long as it is a solvent capable of dissolving the polysilazane, and organic solvents that are free from water and reactive groups (for example, a hydroxyl group, or an amine group or the like), which easily react with the polysilazane, and are inert against the polysilazane, are preferable, and aprotic organic solvents are more preferable. Specific examples of the solvent for preparing the polysilazane-containing application liquid can include aprotic solvents; for example, hydrocarbon solvents such as aliphatic hydrocarbons, alicyclic hydrocarbons and aromatic hydrocarbons such as pentane, hexane, cyclohexane, toluene, xylene, solvesso and terbene; halogen hydrocarbon solvents such as methylene chloride and trichloroethane; esters such as ethyl acetate and butyl acetate; ketones such as acetone and methyl ethyl ketone; ethers such as aliphatic ethers and alicyclic ethers such as dibutyl ether, dioxane and tetrahydrofuran: for example, tetrahydrofuran, dibutyl ether, mono- and polyalkylene glycol dialkyl ethers (diglymes) and the like. The above-mentioned solvent is selected according to purposes such as the solubility of the polysilazane and the vaporization velocity of the solvent, and may be used singly or in the form of a mixture of two or more kinds.

The concentration of the polysilazane in the polysilazane-containing application liquid is not specifically limited, and differ depending on the film thickness of the target gas barrier layer and the pot life of the application liquid, and is preferably from 0.1 to 30% by mass, more preferably from 0.5 to 20% by mass, and specifically preferably from 1 to 15% by mass.

In order to promote the modification to an acid silicon nitride, it is preferable that the polysilazane-containing application liquid contains a catalyst together with the polysilazane. As the catalyst that can be applied to the present invention, a basic catalyst is preferable, and specific examples include amine catalysts such as N,N-diethylethanolamine, N,N-dimethylethanolamine, triethanolamine, triethylamine, 3-morpholinopropylamine, N,N,N',N'-tetramethyl-1,3-diaminopropane and N,N,N',N'-tetramethyl-1,6-diaminohexane, metal catalysts such as Pt compounds such as Pt acetylacetonate, Pd compounds such as Pd propionate and Rh compounds such as Rh acetylacetonate, and N-heterocyclic compounds. Among these, it is preferable to use amine catalysts. The concentration of the catalyst added at this time is preferably in the range of from 0.1 to 10% by mass, more preferably in the range of from 0.2 to 5% by mass, further preferably in the range of from 0.5 to 2% by mass on the basis of the polysilazane. By setting the addition amount of the catalyst to be in this range, excess formation of silanol due to the rapid progress of the reaction, and decrease in the film density, increase in the film defect, and the like can be avoided.

For the polysilazane-containing application liquid according to the present invention, where necessary, the additives exemplified below can be used. For example, cellulose ethers, cellulose esters; for example, natural resins such as ethyl cellulose, nitro cellulose, cellulose acetate and cellulose acetobutylate; for example, synthetic resins such as rubber and rosin resin; for example, condensed resins such as polymerized resins; for example, amino plasts, specifically urea resins, melamine-formaldehyde resins, alkid resins, acrylic resins, polyesters or modified polyesters, epoxides, polyisocyanates or blocked polyisocyanates, polysiloxanes and the like.

The above-mentioned polysilazane-containing application liquid can also be used by mixing with a compound of an element of Group 13 of the Long Format Periodic Table (an additional element compound). By this way, the gas barrier property of the obtained gas barrier film can be improved. As the element of Group 13 of the Long Format Periodic Table and the specific form of the compound, those similar to the element M and additional element compound in the silicon-containing film mentioned below can be used.

As the method for applying the polysilazane-containing application liquid, a conventionally-known suitable wet application method can be adopted. Specific examples include a spin coat process, a die coat process, a roll coat process, a flow coat process, an inkjet process, a spray coat process, a print process, a dip coat process, a cast film formation process, a bar coat process, a gravure print process and the like.

The application thickness can be suitably preset depending on the purpose. For example, the application thickness is such that the thickness after drying is preferably from about 10 nm to 10 μm, more preferably from 15 nm to 1 μm, and further preferably from 20 to 500 nm. When the film thickness of the polysilazane layer is 10 nm or more, a sufficient barrier property can be obtained, whereas when the film thickness is 10 μm or less, a stable application property can be obtained in the formation of the polysilazane layer, and a high beam permeability can be attained.

(Modification Treatment)

The modification treatment in the present invention refers to a reaction in which a part or entirety of the polysilazane compound is converted to silicon oxide or silicon oxide nitride.

By this way, an inorganic thin film having a gas barrier layer at a level that the gas barrier layer as a whole can contribute to the expression of a gas barrier property (a water vapor transmittance of $1 \times 10^{-3}$ g/m$^2$·day or less) can be formed.

Specifically, a thermal treatment, a plasma treatment, an active energy ray irradiation treatment and the like can be exemplified. Among these, a treatment by irradiating active energy ray is preferable since the modification is possible at a low temperature and the freeness of selection of the kind of the substrate is high.

(Heating Treatment)

Examples of the method for the thermal treatment include, but are not limited to, a method including bringing a substrate into contact with a heat generator such as a heat block, and heating a coating by heat conduction, a method including heating an environment on which a coating is mounted, by using an external heater such as a resistance wire or the like, a method including using a light in the infrared area such as an IR heater, and the like. In the case when the thermal treatment is conducted, it is sufficient to suitably select a method by which the smoothness of the coating can be maintained.

The temperature for heating the coating is preferably in the range of from 40 to 250° C., more preferably in the range of from 60 to 150° C. The heating time is preferably in the range of from 10 seconds to 100 hours, preferably in the range of from 30 seconds to 5 minutes.

(Plasma Treatment)

As the plasma treatment that can be used as the modification treatment in the present invention, a known method can be used, and an atmospheric pressure plasma treatment and the like can be preferably exemplified. In an atmospheric pressure plasma CVD process in which a plasma CVD treatment is conducted in the vicinity of an atmospheric pressure, it is not necessary to reduce the pressure and the producibility is high, and the film formation velocity is fast since the plasma density is a high density, as compared to a plasma CVD process under vacuum, and further, since the average free step of a gas is very short under a high pressure condition of the atmospheric pressure, as compared to the conditions for a general CVD process, an extremely homogeneous film can be obtained.

In the case of the atmospheric pressure plasma treatment, nitrogen gas, or atoms of Group 18 of the Long Format Periodic Table, specifically, helium, neon, argon, crypton, xenon, radon and the like are used as the discharging gas. Among these, nitrogen, helium and argon are preferably used, and nitrogen is inexpensive and thus is specifically preferable.

(Active Energy Ray Irradiation Treatment)

As the active energy ray, for example, infrared ray, visible ray, ultraviolet ray, X-ray, electron beam, α-ray, β-ray, γ-ray and the like can be used, and electron beam or ultraviolet ray is preferable, and ultraviolet ray is more preferable. Ozone and active oxygen atoms generated by ultraviolet ray (synonymous with ultraviolet light) have a high oxidation ability, and thus it is possible to form a gas barrier layer that has high denseness and insulation property at a low temperature.

In the ultraviolet ray irradiation treatment, either of generally-used ultraviolet generating devices can be used.

In the method for the manufacture of the gas barrier layer in the present invention, the coating containing the polysilazane compound from which water content has been removed is modified by a treatment by ultraviolet light irradiation. Ozone and active oxygen atoms generated by ultraviolet ray (synonymous with ultraviolet light) have a high oxidation ability, and thus it is possible to form a silicon oxide film or silicon oxide nitride film that has high denseness and insulation property at a low temperature.

By this ultraviolet light irradiation, $O_2$ and $H_2O$, which contribute to the formation of a ceramic, the ultraviolet absorber, and the polysilazane itself are excited and activated. Furthermore, the formation of a ceramic from the excited polysilazane is promoted, and the obtained ceramic film becomes dense. The ultraviolet light irradiation is effective even if it is conducted at any timepoint after formation of the coating.

For the vacuum ultraviolet light irradiation treatment in the present invention, it is possible to use either of generally-used ultraviolet generating device. The ultraviolet light as referred to in the present invention generally means ultraviolet light containing an electromagnetic wave having a wavelength of from 10 to 200 nm called as vacuum ultraviolet light.

In the irradiation of vacuum ultraviolet light, it is preferable to preset the irradiation intensity and irradiation time to the extent that an unmodified substrate that carries the layer containing a polysilazane compound to be irradiated is not damaged.

For example, in the case when a plastic film is used as the substrate, for example, irradiation for 0.1 seconds to 10 minutes can be conducted by using a lamp of 2 kW (80 W/cm×25 cm), with presetting the distance between the substrate and the ultraviolet irradiation lamp so that the intensity on the surface of the substrate become 20 to 300 mW/cm$^2$, preferably 50 to 200 mW/cm$^2$.

In general, when the temperature of a substrate in a ultraviolet irradiation treatment becomes 150° C. or more, in the case of a plastic film or the like, the properties of the substrate are deteriorated, such as modification of the substrate, and deterioration of the strength thereof. However, in the case of a film having a high heat-resistance such as a polyimide, a modification treatment at a higher temperature is possible. Therefore, the temperature of the substrate in this ultraviolet irradiation does not have a general upper limit, and thus can be suitably preset by a person skilled in the art depending on the kind of the substrate. Furthermore, the atmosphere for ultraviolet irradiation is not specifically limited, and it is sufficient to conduct in the air.

Examples of the such means for generating ultraviolet ray include, but are not limited to, a metal halide lamp, a high pressure mercury lamp, a low pressure mercury lamp, a xenon arc lamp, a carbon arc lamp, an excimer lamp, a UV light laser and the like. Furthermore, when the unmodified polysilazane layer is irradiated with the generated ultraviolet ray, it is desirable to allow the ultraviolet ray from the generation source to reflect on a reflector plate and then shine the ray on the unmodified polysilazane layer, from the viewpoint of achievement of improvement of the efficiency and even irradiation.

The ultraviolet irradiation can be applied to either a batch treatment or a continuous treatment, and can be suitably selected depending on the shape of the substrate used. In the case when the substrate having an application layer containing a polysilazane compound has a long film shape, this substrate can be formed into a ceramic by continuously irradiating with ultraviolet ray in a drying zone equipped with a ultraviolet generation source as mentioned above while conveying the substrate. The time required for the ultraviolet irradiation is generally from 0.1 seconds to 10 minutes, preferably from 0.5 seconds to 3 minutes depending on the compositions and concentrations of the substrate and the application layer containing a polysilazane compound to be used.

(Vacuum Ultraviolet Irradiation Treatment: Excimer Irradiation Treatment)

The most preferable modification treatment method in the present invention is a treatment by vacuum ultraviolet irradiation (an excimer irradiation treatment).

In the vacuum ultraviolet light (VUV) irradiation, as these gases other than oxygen, a dried inert gas is preferably used, and dried nitrogen gas is specifically preferable in view of cost. The oxygen concentration can be adjusted by measuring the flow amounts of oxygen gas and inert gas to be introduced in an irradiation chamber, and changing the flow amount rate.

Specifically, the method for the modification treatment of a unmodified layer containing a polysilazane compound in the present invention is a treatment by vacuum ultraviolet light irradiation. The treatment by vacuum ultraviolet light irradiation is a method for forming a silicon oxide film at a relatively low temperature by promoting an oxidation reaction by active oxygen and ozone while directly cutting atomic bonds by the action of only photons, which is called as a light photon process, by using a light energy of 100 to 200 nm, preferably by using a light energy of light at a wavelength of from 100 to 180 nm, which is higher than the interatomic bonding force in the polysilazane compound. As the vacuum ultraviolet light source necessary for this method, a rare gas excimer lamp is preferably used.

The excimer lamp is characterized by its high efficiency since the radiations are focused in one wavelength and lights other than the necessary light are radiated little. Furthermore, since excess light is not radiated, the temperature of a subject can be kept low. In addition, since a time is not necessary for the starting and restarting, instant lighting and blinking are possible.

In the vacuum ultraviolet irradiation step in the present invention, the illuminance of the vacuum ultraviolet ray on the coating surface that is received by the coating containing a polysilazane compound is preferably from 1 mW/cm$^2$ to 10 W/cm$^2$, more preferably from 30 mW/cm$^2$ to 200 mW/cm$^2$, and further preferably from 50 mW/cm$^2$ to 160 mW/cm$^2$. When the illuminance is 1 mW/cm$^2$ or more, a sufficient modification efficiency can be obtained. When the illuminance is 10 W/cm$^2$ or less, the abrasion of the coating is difficult to occur, and the substrate is difficult to be damaged.

The amount of the irradiation energy of the vacuum ultraviolet ray in the layer containing a polysilazane compound is preferably from 10 to 10,000 mJ/cm$^2$, more preferably from 100 to 8,000 mJ/cm$^2$, further preferably from 200 to 6,000 mJ/cm$^2$, and specifically preferably from 500 to 5,000 mJ/cm$^2$. If the amount is 10 mJ/cm$^2$ or more, a sufficient modification efficiency can be obtained, and if the amount is 10,000 mJ/cm$^2$ or less, cracks and heat deformation of the substrate are difficult to occur.

Furthermore, the oxygen concentration in the irradiation of vacuum ultraviolet light (VUV) is preferably set to be from 10 ppm by volume to 10,000 ppm by volume (1% by volume), more preferably from 100 ppm by volume to 10,000 ppm by volume (1% by volume), further preferably from 100 ppm by volume to 1,000 ppm by volume. By adjusting to be in such range of oxygen concentration, generation of a gas barrier layer with excess oxygen can be prevented to thereby prevent the deterioration of the gas barrier property.

Furthermore, an Xe excimer lamp is excellent in luminescence efficiency since it radiates ultraviolet ray having a short wavelength at 172 nm in a single wavelength. Since this light has a large oxygen absorption coefficient, radical oxygen atomic species and ozone can be generated at high concentrations with a trace amount of oxygen. Furthermore, it is known that the energy of light having a short wavelength at 172 nm, which dissociates the bonds of organic substances, has high abilities. By the high energy possessed by these active oxygen and ozone and ultraviolet irradiation, the modification of the application layer containing a polysilazane compound can be attained within a short time.

Accordingly, the Xe excimer lamp enables shortening of the processing time in accordance with a high throughput, decreasing of a facility surface area, irradiation to organic materials, plastic substrates, resin films and the like, which are susceptible to damage by heat, as compared to a low pressure mercury lamp, which emits at wavelengths of 185 nm and 254 nm, and plasma washing.

In the above-mentioned layer formed by application, a part of the polysilazane is modified in the step of irradiating the coating containing a polysilazane compound with vacuum ultraviolet, whereby a silicon-containing film as a gas barrier film containing oxide nitride carbide silicon represented by a composition of $SiO_xN_yC_z$ or $SiO_xN_yC_zM_w$ as the entirety of the layer is formed.

The film composition can be measured by measuring an atom composition ratio by using an XPS surface analyzer. Alternatively, the film composition can also be measured by cutting the silicon-containing film and measuring the atom composition ratio of the cross-sectional surface by an XPS surface analyzer.

Furthermore, the film density can be suitably preset depending on the purpose. For example, the film density of the silicon-containing film is preferably in the range of from 1.5 to 2.6 g/cm$^3$. Within this range, the denseness of the film is improved, and thus the deterioration of the gas barrier property, and the deterioration of the film under conditions of a high temperature and a high humidity can be prevented.

(Intermediate Layer)

An intermediate layer may further be formed between the substrate of the gas barrier film and the gas barrier layer. It is preferable that the intermediate layer has a function to improve the adhesiveness between the substrate surface and the gas barrier layer. A commercially available substrate with an easy adhesive layer may also be preferably used.

(Smooth Layer)

In the gas barrier film in the present invention, the above-mentioned intermediate layer may be a smooth layer. The smooth layer used in the present invention is provided so as to planarize a rough surface on which projections and the like are present of the substrate, or to planarize by filling unevenness and pinholes that have been generated on the gas barrier layer by the projections that are present on the substrate. Such smooth layer is basically prepared by curing a photosensitive material or a thermosetting material.

(Bleed-Out Preventing Layer)

In the gas barrier film according to the present invention, a bleed-out preventing layer may be disposed on the side of the surface of the substrate opposite to the surface on which the gas barrier layer is disposed. The bleed-out preventing layer can be provided. The bleed-out preventing layer is provided to the surface of the substrate opposite to the surface having the smooth layer, for the purpose of suppressing a phenomenon in which the unreacted oligomer and the like transfer to the surface from the film substrate when the film having the smooth layer is heated and contaminate the surface to be contacted. The bleed-out preventing layer may basically have the same constitution as that of the smooth layer as long as the bleed-out preventing layer has this function.

(Overcoat Layer)

An overcoat layer may be disposed on the gas barrier layer according to the present invention.

As the materials used for the overcoat layer, organic-inorganic composite resins using organic resins such as organic monomers, oligomers, polymers and the like, organic-inorganic composite resins using monomers, oligomers, polymers and the like of siloxanes and silsesquioxanes having organic groups can be preferably used.

[Electrode]

As the materials used for the electrode, for example, transparent metal oxides such as indium tin oxide (ITO), AZO (aluminum-doped zinc oxide), FTO (fluorine-doped tin oxide), $SnO_2$, ZnO and titanium oxide, metals such as Ag, Al, Au, Pt, Cu, Rh, In, Ni, Pd and Mo, or nanowires such as metal nanowires and carbon nanotubes, nanoparticles, and the like can be used. The electrode may be an electrode having a structure in which two or more kinds of metals are stacked.

The electrode can be prepared by forming a thin film from these electrode substances by a method such as deposition or sputtering. Furthermore, the film thickness is selected in the range of generally from 100 nm to 5 μm, preferably from 100 to 500 nm.

The method for forming the electrode having a shape of a stripe-like or the like is not specifically limited, and a conventionally-known method can be utilized. For example, a thin film is formed by a method such as deposition or sputtering of a substrate, and the thin film can be processed into a desired shape by a method of etching using a known photolithography process or the like.

[Silicon-Containing Film]

The electronic device according to the present invention contains a silicon-containing film that coats at least the electrode.

The above-mentioned silicon-containing film has a composition represented by the following chemical formula (1).

[Chemical Formula 7]

$$SiO_xN_yC_z \qquad (1)$$

In the formula, x, y and z are respectively atomic ratios of oxygen, nitrogen and carbon to silicon, and satisfy $0 \le y < 0.3$, $3 < 2x+5y \le 5$ and $0.01 < z < 1$ (composition 1), or satisfy $0.3 \le y < 0.7$, $3 < 2x+5y \le 5$ and $0 \le z < 1$ (composition 2).

In the composition of the chemical formula (1), by providing a composition such that the values of x and y satisfy $3 < 2x+5y \le 5$, easiness of plastic deformation that is necessary as a material for planarization for forming a bonding part by room-temperature bonding can be achieved. Furthermore, by controlling the values of y and z depending on the range of the value of y as in composition 1 or composition 2, a property of blocking water content and gas, and bendability can be achieved with good balance. The silicon-containing film of composition 1 can be easily formed by vapor phase film formation, or by using a polysilazane compound. The silicon-containing film of composition 2 can be mainly formed by vapor phase film formation.

(Composition 1)

The above-mentioned silicon-containing film $SiO_xN_yC_z$ has, as composition 1, a composition that satisfies $0 \le y < 0.3$, $3 < 2x+5y \le 5$, and $0.01 < z < 1$.

The composition 1 of the silicon-containing film is a composition in which the atomic ratio y of nitrogen to silicon is less than 0.3. In an environment under a general humidity, since the N site of the composition $SiO_xN_yC_z$ can react with water vapor, it can be considered that the ability of the silicon-containing film to absorb water vapor is higher and thus a gas barrier property can be ensured more at a larger value of the atomic ratio y of nitrogen to silicon. However, as the value of y increases, the resistance against humidity and heat tends to decrease. In the composition 1, the atomic ratio y of nitrogen to silicon is more preferably $0 \le y \le 0.25$, further preferably $0.01 < y \le 0.1$.

In the above-mentioned silicon-containing film $SiO_xN_yC_z$, in the case of the composition wherein the atomic ratio y of nitrogen to silicon is less than 0.3 (composition 1), the atomic ratio z of carbon to silicon satisfies 0.01<z<1. In the case of the composition wherein the atomic ratio y of nitrogen to silicon is less than 0.3 (composition 1), the elastic modulus of the silicon-containing film tends to increase. However, in the case when the elastic modulus of the film is high, very high film smoothness is required in bonding by room-temperature bonding. However, by presetting the atomic ratio z of carbon to silicon to be more than 0.01, the elastic modulus of the film is decreased. When the elastic modulus of the film is decreased, it is considered that the film is easily plastic-deformed, and the unevenness of the surface to be bonded can be alleviated to some extent in bonding, and thus it becomes possible to conduct bonding by room-temperature bonding.

Furthermore, the carbon component has an effect to improve the bending resistance of the film without deteriorating the gas barrier property. In the above-mentioned composition 1 of the silicon-containing film, in the case when the value of the atomic ratio z of carbon to silicon is 0.01 or less, resistance against bending cannot be sufficiently obtained, and consequently, the stability of the electronic device cannot be sufficiently obtained. On the other hand, if the atomic ratio z of carbon to silicon becomes 1 or more, the gas barrier property becomes insufficient, and permeation of water content and oxygen from the bonding part occurs, and thus the stability of the electronic device cannot be sufficiently obtained. More preferably, the atomic ratio z of carbon to silicon is 0.01<z<0.20, more preferably 0.05<z<0.20.

In the above-mentioned composition 1 of the silicon-containing film $SiO_xN_yC_z$, the atomic ratio x of oxygen to silicon is not specifically limited, and preferably satisfies 1.0≤x<2.5. When x is 1.0 or more, a silicon-containing film having excellent resistance against heat and humidity can be obtained. On the other hand, when x is less than 2.5, a silicon-containing film having a high gas barrier property can be obtained. More preferably, the atomic ratio x of carbon to silicon is 1.0≤x≤2.0.

Furthermore, in composition 1, the atomic ratio x of oxygen and the atomic ratio y of nitrogen to silicon satisfy 3<2x+5y≤5. When 2x+5y is 3 or less, the gas barrier property of the silicon-containing film decreases, and permeation of water content and oxygen from the bonding part occurs, and thus the stability of the electronic device cannot be sufficiently obtained. On the other hand, when 2x+5y exceeds 5, the silicon-containing film is hardened and thus does not follow the unevenness, whereby the adhesive force in bonding is weakened. Furthermore, resistance against bending cannot be sufficiently obtained. Consequently, the stability of the electronic device cannot be sufficiently obtained. In the silicon-containing film having composition 1, it is more preferable to satisfy 3.5<2x+5y<4.5.

Furthermore, in the case when the atomic ratio y of nitrogen to silicon is less than 0.3, the film tends to be totally hard, but the film becomes soft by setting the composition to contain an element of Group 13 of the Long Format Periodic Table as mentioned below, and thus the adhesive force can be improved.

(Composition 2)

The above-mentioned silicon-containing film $SiO_xN_yC_z$ has a composition that satisfies 0.3≤y<0.7, 3<2x+5y≤5 and 0≤z<1 as composition 2.

In an environment under a general humidity, since the N site of the composition $SiO_xN_yC_z$ can react with water vapor, it can be considered that the ability of the silicon-containing film to absorb water vapor is higher and thus a gas barrier property can be ensured more at a larger value of the atomic ratio y of nitrogen to silicon. However, when the value of y exceeds 0.7, the Si—N—Si bond is hydrolyzed by humidity and heat when the silicon-containing film is stored under a severe high temperature-high humidity condition, and thus Si—OH is generated, and a part thereof forms a Si—O—Si bond, but this consequently leads to the deterioration of the gas barrier property. That is, if the value of the atomic ratio y of nitrogen to silicon is too large when the silicon-containing film is stored under a severe high temperature-high humidity condition, this conversely leads to the deterioration of the gas barrier property. Consequently, stability against humidity and heat cannot be sufficiently obtained. More preferably, the atomic ratio y of nitrogen to silicon in composition 2 is 0.4<y<0.65.

In composition 2, the atomic ratio x of oxygen and the atomic ratio y of nitrogen to silicon satisfy 3<2x+5y≤5. When 2x+5y is 3 or less, the gas barrier property of the silicon-containing film decreases, and permeation of water content and oxygen from the bonding part occurs, and thus the stability of the electronic device cannot be sufficiently obtained. On the other hand, when 2x+5y exceeds 5, the silicon-containing film is hardened and thus does not follow the unevenness, whereby the adhesive force in bonding is weakened. Furthermore, resistance against bending cannot be sufficiently obtained. Consequently, the stability of the electronic device cannot be sufficiently obtained. In the silicon-containing film having composition 2, it is more preferable to satisfy 3.5<2x+5y<4.5.

In composition 2, the atomic ratio x of oxygen to silicon is not specifically limited as long as it is in a range that satisfies 3<2x+5y≤5, and is preferably 0.30<x≤1, more preferably 0.30<x<0.80. When the value of x exceeds 0.30, a film that is excellent in humidity-heat resistance can be obtained. Furthermore, when the value of x is 1 or less, a film having excellent gas barrier property can be obtained. Therefore, the effect of being capable of suppressing permeation of water content and oxygen in the bonding part is high.

In composition 2, the atomic ratio z of carbon to silicon is 0≤z<1, preferably 0≤z<0.2. When the value of z is 0 or more and less than 1, a film having an excellent gas barrier property can be obtained. Therefore, the effect of being capable of suppressing the permeation of water content and oxygen in the bonding part is high.

Preferably, the above-mentioned silicon-containing film further contains an element M selected from the elements of Group 13 in the Long Format Periodic Table, and has a composition represented by the following chemical formula (2).

[Chemical Formula 8]

$$SiO_xN_yC_zM_w \qquad (2)$$

In the formula, x, y, z and w are respectively atomic ratios of oxygen, nitrogen, carbon and M to silicon, and satisfy 0≤y<0.3, 3<2x+5y≤5, 0.01<z<1 and 0.01<w<0.5.

The element M is not specifically limited as long as it is an element of Group 13 of the Long Format Periodic Table, and is preferably boron, aluminum, gallium or indium, more preferably boron, aluminum or indium, and specifically preferably aluminum. Since the elements of Group 13 such as boron, aluminum, gallium and indium have an atomic valency of trivalent and thus are deficient in number of valency as compared to tetravalent, which is the atomic valency of silicon, the flexibility of the film is increased. By this improvement of flexibility, defects are repaired, and modification can be conducted evenly and thus a dense film can be obtained, and the stability of the Si—N—Si bond under a high temperature-high humidity condition is improved. Consequently, the permeation of water content and oxygen from the bonding part is decreased, and an electronic device having excellent stability can be obtained. Furthermore, since the flexibility of the film is increased, the film easily follows the unevenness in the bonding, and thus the adhesive force can be improved.

It is preferable that the atomic ratio w of M to silicon satisfies 0.01<w<0.5. When w is more than 0.01, the effect of the present invention can be obtained more significantly. Furthermore, if w is less than 0.5, the gas barrier property of the silicon-containing film is maintained, and a problem of coloring is difficult to occur. The w is preferably from 0.02 to 0.25, more preferably from 0.05 to 0.2.

With respect to the composition represented by the chemical formula (2), the values of the atomic ratios of oxygen, nitrogen and carbon to silicon are similar to that in the composition 1, and thus the explanation thereof is omitted.

In addition, in the present invention, the values of x, y and z, and w mentioned above can be determined by, for example, by measuring the elemental ratios (atomic ratios) of the respective constitutional elements in the film thickness direction by using the following device and method.

Conditions for XPS analysis
Device: QUANTERASXM (manufactured by ULVAC-PHI, Inc.)
X-ray source: monochromatic Al—Kα
Measurement areas: Si2p, C1s, N1s, O1s, Al
Sputter ion: Ar (2 keV)
Depth profile: Measurements are repeated after 1 minute of sputtering. One measurement corresponds to a thickness component of about 5 nm in terms of a $SiO_2$ thin film standard sample.
Quantification: A background was determined by the Shirley process, and quantification was conducted from the obtained peak surface area by using a relative sensitivity coefficient process.
Data processing: MultiPak (manufactured by ULVAC-PHI, Inc.)

Since the effects of water adsorbed on the surface and pollution by organic substances are present, the first measurement data is excluded.

The silicon-containing film may be a single layer or a stacked structure of two or more layers. Furthermore, in the case of a stacked structure of two or more layers, the silicon-containing film may have the same composition or different compositions as long as the chemical composition represented by the above-mentioned chemical formula (1) is satisfied.

The above-mentioned silicon-containing film has an elastic modulus measured by the nanoindentation process of preferably from 20 to 40 GPa, more preferably from 25 to 35 GPa. If the elastic modulus of the film is 20 GPa or more, an effect of sufficiently following the unevenness of the surface of the substrate can be obtained, and thus a bond having a high adhesive force can be easily formed even in room-temperature bonding for which high surface planeness is required. When the film has an elastic modulus of 40 GPa or less, a dense film having low permeability against water content and gases is formed. As the value of the elastic modulus of the film, the value measured in the method described in the Examples is adopted.

In the case when the above-mentioned silicon-containing film $SiO_xN_yC_z$ satisfies $0.3 \leq y < 0.7$ and $3 < 2x+5y \leq 5$ (composition 2), the bonds of the oxygen and nitrogen are not saturated against the bonds of Si, and the conductance of the silicon-containing film is changed depending on the state of the unsaturated bonds, and it is preferable that at least a part of the bonds of Si is H. By the changing of at least a part of the bonds of Si to H, the followability can further be improved. The composition of H in the silicon-containing film can be easily measured by observing the absorption by the expansion and contraction of Si—H in an infrared absorption spectrum. Specifically, it is preferable that the ratio of the intensity of the absorption by the expansion and contraction of Si—H in the vicinity of 2210 $cm^{-1}$ to the intensity of the absorption by the expansion and contraction of Si—O in the vicinity of 1,080 $cm^{-1}$ is more than 0.1 and less than 1.0. When the above-mentioned ratio is more than 0.1, the followability of the film is increased, and thus the sealing property can further be improved. Furthermore, when the above-mentioned ratio is less than 1.0, it is preferable in view of the denseness of the film. More preferably, the above-mentioned ratio of the absorption intensity of the Si—H to the absorption intensity of Si—O is from 0.4 to 0.8. In the case when a silicon-containing film is formed on a glass substrate, the effect of the absorption of the Si—O in the glass substrate is present, and thus the infrared absorption of the silicon-containing film can be measured by, for example, forming the silicon-containing film on a plate of KBr or CaF.

The thickness of the silicon-containing film that coats at least the electrode is not specifically limited. From the viewpoint of coating of the electrode, the thickness is preferably thick, and is preferably 10 μm or less, specifically preferably 1 μm or less, from the viewpoints of producibility and prevention of easy cracking against bending. Furthermore, the necessary lower limit value of the thickness varies depending on the thickness of the electrode, and is preferably at a height of ⅓ or more, further preferably ⅔ or more, specifically preferably 1.5 times or more with respect to the thickness of the electrode. When the thickness is ⅓ or more with respect to the thickness of the electrode, the surface of the substrate generated by the electrode can be sufficiently planarized, and thus the substrate and the sealing substrate can be easily bonded by room-temperature bonding.

The size of the silicon-containing film in the plane direction is any size as long as the film coats at least the electrode, and the silicon-containing film may also be formed so as to coat the electronic element main body.

(Method for Manufacturing Silicon-Containing Film)

The method for manufacturing the above-mentioned silicon-containing film having the composition represented by the chemical formula (1) is not specifically limited. For example, the silicon-containing film can be prepared by a similar method to that for the above-mentioned gas barrier layer.

Preferably, among the above-mentioned methods for preparing the gas barrier layer, a plasma CVD process, or a method of forming by a modification treatment of a layer containing a polysilazane can be preferably used. Specifically, the method of forming by a modification treatment of a layer containing a polysilazane can be preferably used. The method of forming a layer containing a polysilazane by a modification treatment is preferable since a surface of the silicon-containing film with a plane surface can be easily obtained.

In the case when the silicon-containing film is formed by a plasma CVD process, it is preferable to use, for example, a plasma CVD device as in FIG. 3 (not a roll-to-roll system of but a system in which the substrate is fixed). At this time, by adjusting the kind of the raw material gas, the flow amount ratio of the raw material gas and reaction gas, the feeding gas pressure (the feeding amounts of the raw material gas and the reaction gas), the applied electrical power, the line speed (conveying velocity) and the like, the silicon-containing film having the composition represented by the chemical formula (1) can be obtained.

In the case when the silicon-containing film is formed by the modification treatment of the layer containing a polysilazane, the silicon-containing film having a desired composition can be obtained by, for example, controlling the kind of the used polysilazane compound, the conditions for the modification.

For example, the atomic ratio x of oxygen to silicon can be controlled by the modification treatment mentioned below. For example, when the oxygen concentration during the modification is low, the value of x tends to be small, whereas when the oxygen concentration during the modification is high, the value of x tends to be large. Furthermore, in the case when applied on a resin substrate, x tends to be large since the water content from the resin substrate is fed.

As a means for controlling the value of the atomic ratio y of nitrogen to silicon, in the case when vacuum ultraviolet ray is irradiated during the modification is exemplified, the value of y tends to be small when the irradiation energy of the vacuum ultraviolet ray is large, whereas the value of y tends to be large when the irradiation energy of the vacuum ultraviolet ray is small.

Furthermore, for the value of the atomic ratio z of carbon to silicon, the value of z tends to be large by introducing the carbon atom from the substituent of the polysilazane, or in the case when the element M is contained, from the substituent of the compound containing the element M. Furthermore, the value tends to be small by increasing the amount of the irradiated energy of the vacuum ultraviolet ray, and can be 0 (i.e., a state in which carbon is absent).

Furthermore, while the value of the atomic ratio x of oxygen to silicon tends to decrease by decreasing the oxygen concentration during the modification, the values of the atomic ratios y and z of nitrogen and carbon to silicon tend to increase.

The atomic ratio w of the element M to silicon can be controlled by adjusting the amount of the additional element compound mentioned below with respect to the amount of the silicon contained in the above-mentioned polysilazane. The value of w does not substantially change even the application drying, modification treatment and the like for forming the silicon-containing film mentioned below are conducted.

(Polysilazane Compound)

The polysilazane compound that can be used for forming the silicon-containing film preferably has a structure of the following general formula (I).

[Chemical Formula 9]

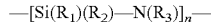 General formula (I):

In the above-mentioned general formula (I), $R_1$, $R_2$ and $R_3$ are each independently a hydrogen atom, or a substituted or unsubstituted alkyl group, aryl group, vinyl group or (trialkoxysilyl)alkyl group. At this time, $R_1$, $R_2$ and $R_3$ may be the same or different from one another. Examples of the alkyl group include straight chain, branched chain or cyclic alkyl groups having a carbon atom number of from 1 to 8. More specific examples include a methyl group, an ethyl group, an n-propyl group, an isopropyl group, an n-butyl group, an isobutyl group, a sec-butyl group, a tert-butyl group, an n-pentyl group, an isopentyl group, a neopentyl group, an n-hexyl group, an n-heptyl group, an n-octyl group, a 2-ethylhexyl group, a cyclopropyl group, a cyclopentyl group, a cyclohexyl group and the like. Furthermore, examples of the aryl group include aryl groups having a carbon atom number of from 6 to 30. More specific examples include non-condensed hydrocarbon groups such as a phenyl group, a biphenyl group, a terphenyl group and the like; and condensed polycyclic hydrocarbon groups such as a pentalenyl group, an indenyl group, a naphthyl group, an azulenyl group, a heptalenyl group, a biphenylenyl group, a fluorenyl group, an acenaphthylenyl group, a preadenyl group, an acenaphthenyl group, a phenalenyl group, a phenanthryl group, an anthryl group, a fluoranetenyl group, an acephenanethrylenyl group, an aceantrilenyl group, a triphenylenyl group, a pyrenyl group, a crycenyl group, a naphthacenyl group and the like. Examples of the (trialkoxysilyl)alkyl group include alkyl groups having a carbon atom number of from 1 to 8 and having a silyl group substituted with an alkoxy group having a carbon atom number of from 1 to 8. More specific examples include a 3-(triethoxysilyl)propyl group, a 3-(trimethoxysilyl)propyl group and the like. The substituents that are optionally present in the above-mentioned $R_1$ to $R_3$ are not specifically limited, and examples include alkyl groups, halogen atoms, a hydroxy group (—OH), a mercapto group (—SH), a cyano group (—CN), a sulfo group (—SO$_3$H), a carboxy group (—COOH), a nitro group (—NO$_2$) and the like. The substituents that are optionally present are not the same as $R_1$ to $R_3$ that are substituted. For example, in the case when $R_1$ to $R_3$ are alkyl groups, $R_1$ to $R_3$ are not further substituted with an alkyl group. Among these, $R_1$, $R_2$ and $R_3$ are preferably a hydrogen atom, a methyl group, an ethyl group, a propyl group, an isopropyl group, a butyl group, an isobutyl group, a tert-butyl group, a phenyl group, a vinyl group, a 3-(triethoxysilyl)propyl group or a 3-(trimethoxysilylpropyl) group.

Furthermore, in the above-mentioned general formula (I), n is an integer that represents the number of the constitutional unit of the formula: —[Si(R$_1$)(R$_2$)—N(R$_3$)]—, and is preferably defined so that the polysilazane compound having a structure represented by the general formula (I) has a number average molecular weight of from 150 to 150,000 g/mol.

In the present invention, one of the preferable aspects of the compound having a structure represented by the above-mentioned general formula (I) is perhydropolysilazane in which all of $R_1$, $R_2$ and $R_3$ are hydrogen atoms.

On the other hand, an organopolysilazane in which a part of the hydrogen atom parts that are bonded to the Si thereof has been substituted with alkyl group(s) and the like has an advantage that the adhesiveness to the substrate, which is a primer, is improved by having alkyl group (s) such as a methyl group, and toughness can be imparted to a ceramic film of a polysilazane compound, which is hard and brittle, and thus generation of cracks can be suppressed even in the case when the (average) film thickness it thickened. Therefore, these perhydropolysilazane and organopolysilazane may be suitably selected depending on the intended use, or can be mixed and used.

The structure of the perhydropolysilazane is presumed to be a structure in which straight chain structures and ring structures mainly having 6 and 8-membered rings are present. The perhydropolysilazane has a molecular weight of about 600 to 2,000 (polystyrene conversion) by a number average molecular weight (Mn), is a liquid or solid substance, and differs depending on the molecular weight.

The polysilazane compound is commercially available in the state of a solution dissolved in an organic solvent, and as the commercially available product of the polysilazane solution, those similar to the above-mentioned polysilazane that are used for the formation of the gas barrier layer are exemplified.

Since the preferable embodiments of the solvent for preparing the application liquid containing the polysilazane (hereinafter also simply referred to as a polysilazane-containing application liquid), the concentration of the polysilazane compound in the polysilazane-containing application liquid, the catalyst contained in the polysilazane-containing application liquid, the additives contained in the polysilazane-containing application liquid, and the method for applying the polysilazane-containing application liquid are similar to those for the above-mentioned polysilazane used in the formation of the gas barrier layer, the explanations thereof are omitted here.

(Modification Treatment)

As the modification treatment for the layer containing a polysilazane in the formation of the silicon-containing film, a plasma treatment, an active energy ray irradiation treatment or the like can be preferably used. Among these, a treatment by active energy ray irradiation is preferable from the viewpoint that the modification can be conducted at a low temperature and the degree of freeness of the selection of the substrate species is high. The most preferable modification treatment method is a treatment by vacuum ultraviolet irradiation (an excimer irradiation treatment). Since the specific embodiment of the modification treatment by a plasma treatment or an active energy ray irradiation treatment is similar to that of the modification treatment of the polysilazane used for the formation of the above-mentioned gas barrier layer, the explanation thereof is omitted herein.

However, in the preparation of the silicon-containing film, as the conditions for irradiating vacuum ultraviolet light (VUV), it is preferable to conduct the modification under an environment in which an oxygen and a water content are both 1,000 ppm by volume or less by using a vacuum ultraviolet light of 172 to 200 nm. By adjusting to such range of oxygen concentration, the generation of a gas barrier layer with excess oxygen can be prevented, and thus the deterioration of the gas barrier property can be prevented. Furthermore, when the modification is conducted under the above-mentioned conditions, the ratios of the water content and Si—OH groups that are present on the surface of the obtained film are decreased more, as compared to the case when the layer containing a polysilazane is modified by applying heat in the presence of water content. Therefore, when the room-temperature bonding is conducted, the deterioration of the surface on which the water content and Si—OH groups have been activated on the surface can be prevented. Therefore, it can be considered that bonding with a higher adhesive force is enabled by room-temperature bonding.

In the case when the silicon-containing film containing the element M of Group 13 of the Long Format Periodic Table is prepared as in the chemical formula (2), the silicon-containing film can be prepared by mixing a compound of Group 13 (an additional element compound) with an application liquid containing a polysilazane compound to form an application liquid, and applying and modifying the application liquid in a similar manner.

(Additional Element Compound)

The kind of the additional element compound is not specifically limited.

However, from the viewpoint that a silicon-containing film of a high conductance can be formed more efficiently, an alkoxide of an additional element is preferable as the additional element compound. The "alkoxide of an additional element" herein means a compound having at least one alkoxy group that is bonded to an additional element. The additional element compound may be used singly, or by mixing two or more kinds. Furthermore, as the additional element compound, a commercially available product may be used, or a synthetic product may be used.

Examples of the alkoxide of an additional element include trimethyl borate, triethyl borate, tri-n-propyl borate, triisopropyl borate, tri-n-butyl borate, tri-tert-butyl borate, aluminum trimethoxide, aluminum triethoxide, aluminum tri-n-propoxide, aluminum tri-isopropoxide, aluminum tri-n-butoxide, aluminum tri-sec-butoxide, aluminum tri-tert-butoxide, aluminum acetylacetonate, acetoalkoxy aluminum diisopropylate, aluminum ethylacetoacetate-diisopropylate, aluminum ethylacetoacetate di-n-butylate, aluminum diethylacetoacetate mono-n-butylate, aluminum diisopropylate mono-sec-butylate, aluminum trisacetylacetonate, aluminum trisethylacetoacetate, bis(ethylacetoacetate) (2,4-pentanedionate)aluminum, aluminum alkylacetoacetate diisopropylate, aluminum oxideisopropoxide trimer, aluminumoxide octylate trimer, gallium methoxide, gallium ethoxide, gallium isopropoxide, gallium acetylacetonate, tris(2,4-pentanedionate)indium, indium isopropoxide, indium isopropoxide, indium n-butoxide, indium methoxyethoxide, thallium ethoxide, thallium acetylacetonate and the like. Among these alkoxides of additional elements, triisopropyl borate, aluminum tri-sec-butoxide, aluminum ethylacetoacetate-diisopropylate, gallium isopropoxide, aluminum diisopropylate mono-sec-butylate, aluminum ethylacetoacetate di-n-butylate and aluminum diethylacetoacetate mono-n-butylate are preferable.

Furthermore, the concentration of the additional element compound in the application liquid containing a polysilazane compound is not specifically limited, and is preferably from 0.01 to 20% by mass, more preferably from 0.1 to 10% by mass, further preferably from 0.2 to 5% by mass.

Furthermore, the mass ratio of the polysilazane compound and the additional element compound in the application liquid containing a polysilazane compound is such that the polysilazane compound:the additional element compound=preferably from 1:0.01 to 1:10, more preferably from 1:0.06 to 1:6. In this range a silicon-containing film with a high conductance can be obtained more efficiently.

[Sealing Substrate]

The sealing substrate 12 has a function to seal the electronic element main body 13 by bonding to the above-mentioned substrate 11. The sealing substrate 12 is disposed opposing to the substrate 11 via the electronic element main body 13.

The sealing substrate 12 may be the above-mentioned gas barrier film. Furthermore, in the case when the sealing substrate is a gas barrier film, the sealing substrate 12 and the substrate 11 may have an identical constitution, or may have different constitutions (materials and layer constitutions).

Furthermore, as the sealing substrate 12, metal foils of aluminum (Al), gold (Au), silver (Ag), chromium (Cr), iron (Fe), nickel (Ni), cobalt (Co), copper (Cu), indium (In), tin (Sn), lead (Pb), titanium (Ti), and alloys thereof and the like, in addition to the above-mentioned gas barrier film may also be used.

Furthermore, the sealing substrate 12 may be a member formed of only gas barrier layers having no substrate among the above-mentioned gas barrier films. Specific examples thereof include, for example, metal foils such as aluminum foil and copper foil, the stacked body of an inorganic layer and an organic layer as explained in the item of the above-mentioned gas barrier film, and the like.

The other details of the constitution of the sealing substrate are similar to the contents as explained in the above-mentioned item of Substrate, and thus the explanations thereof are omitted herein.

It is preferable that the above-mentioned substrate and the above-mentioned sealing substrate have flexibility. In this specification, "flexibility" refers to properties of having flexibility, being deflected and modified when a force is applied, and returning to the original shape when the force is removed, and specifically refers to that a bending elastic modulus defined in JIS K7171: 2008 is, for example, from $1.0 \times 10^3$ to $4.5 \times 10^3$ [N/mm$^2$] or less.

<Bonding Part>

As shown in FIG. 1, the bonding part is disposed on the surrounding of the electronic element main body, and is present between the substrate and the sealing substrate. The electrode in the bonding part includes a region coated by a silicon-containing film. The substrate and the sealing substrate, at least one of which is a gas barrier film, are strongly bonded via such bonding part, whereby the entering of oxygen and water content into the electronic element main body can be prevented, and thus an electronic device that is excellent in sealing property and resistance to repetitive bending can be provided.

Furthermore, in the bonding part, an intermediate layer containing Si, Al, Mo and the like may be introduced in between the silicon-containing film on the substrate and the sealing substrate. By introducing the intermediate layer, the surface roughness is decreased more, and the surface is activated more, and thus a higher bond strength than that in the case of direct bonding can be obtained in room-temperature bonding. The intermediate layer may further contain additional elements such as iron, cobalt, nickel, ruthenium, rhodium, palladium, osmium, iridium, platinum and the like by 0.1 to 10 atom %. The above-mentioned additional elements may be present by being dispersed in a film formed of Si, Al, Mo and the like, or may be stacked as a separated layer from the above-mentioned film and then formed.

The thickness of the bonding part is preferably 2.0 μm or less, more preferably 1.0 μm or less, from the viewpoint of increasing of the sealing property, and in view of easiness of bending. The lower limit value of the thickness of the bonding part may vary depending on the thicknesses of the electrode and silicon-containing film, and is, for example, 100 nm or more. The size of the bonding part in the planar direction is also not specifically limited, and in view of certain bonding, the width h of the bonding part shown in FIG. 2 is preferably 0.3 mm or more, more preferably 0.5 mm or more. Furthermore, in view of slim bezel, the width of the bonding part is preferably 1.0 mm or less, more preferably 0.8 mm or less.

Furthermore, as shown in FIG. 2, the bonding part 16 is present on a place at an interval d from the periphery of the electronic element main body 13. The values of the interval d may be identical or different on the respective sides of the periphery of the electronic element main body depending on the shape of the electronic device or the shape of the electronic element main body. Furthermore, the value of the interval d is preferably d ≥10 μm, more preferably d ≥100 μm depending on the size of the electronic device.

[Electronic Element Main Body]

The electronic element main body is the main body of the electronic device. In the embodiment shown in FIG. 1, the electronic element main body is an organic EL element main body. However, the electronic element main body in the present invention is not limited to such embodiment, and a main body of a known electronic device to which sealing with a gas barrier film can be applied can be used. Examples include solar batteries (PV), liquid crystal display elements (LCD), electronic papers, thin film transistors, touch panels and the like. The constitutions of the main bodies of these electronic devices are also not specifically limited, and the main bodies may have known constitutions.

In the embodiment shown in FIG. 1, the electronic element main body (organic EL element main body) 13 has a first electrode (cathode) 17, a hole transport layer 18, a light-emitting layer 19, an electron transport layer 20, a second electrode (anode) 21 and the like. Furthermore, where necessary, a hole injection layer may be disposed between the first electrode 17 and the hole transport layer 18, or an electron injection layer may be disposed between the electron transport layer 20 and the second electrode 21. In the organic EL element, the hole injection layer, the hole transport layer 18, the electron transport layer 20 and the electron injection layer are optional layers that are disposed as necessary.

An organic EL element will be explained below as an example of the constitution of the specific electronic device.

(First Electrode: Anode)

As the first electrode (anode), those containing metals, alloys, electroconductive compounds each having a high work function (4 eV or more) and mixtures thereof as electrode substance(s) are preferably used.

(Hole Injection Layer: Anode Buffer Layer)

A hole injection layer (anode buffer layer) may be allowed to present between the first electrode (anode) and the light-emitting layer or the hole transport layer. The hole injection layer is a layer that is disposed between an electrode and an organic layer for decreasing a driving voltage and improving a light emission luminance.

(Hole Transport Layer)

The hole transport layer is formed of a hole transport material having a function to transport holes, and the hole injection layer and the electron blocking layer can also be included in the hole transport layer in abroad sense. The hole transport layer can be disposed singly, or plural layers can be disposed.

(Light-Emitting Layer)

The light-emitting layer refers to a blue light-emitting layer, a green light-emitting layer and a red light-emitting layer. The order of stacking when the light-emitting layers are stacked is not specifically limited, and the respective light-emitting layers may have non-light-emitting intermediate layers therebetween.

(Electron Transport Layer)

The electron transport layer is formed of a material having a function to transport electrons, and is included in the electron transport layer in a broad sense. The electron injection layer is a layer that is disposed between an electrode and an organic layer for decreasing a driving voltage and improving a light emission luminance.

(Electron Injection Layer: Cathode Buffer Layer)

The electron injection layer (cathode buffer layer), which is formed in the step of forming the electron injection layer, is formed of a material having a function to transport electrons, and is included in the electron transport layer in a significantly broad sense. The electron injection layer is a layer that is disposed between an electrode and an organic layer for decreasing a driving voltage and improving a light emission luminance.

(Second Electrode: Cathode)

As the second electrode (cathode), those containing metals (referred to as electron injectable metals), alloys, electroconductive compounds each having a low work function (4 eV or less) and mixtures thereof as electrode substance(s) are used.

(Protective Layer)

As shown in FIG. 1, where necessary, the electronic device of the present invention may have a protective layer 15 on the electronic element main body. The protective layer has a function to prevent substances that promote the deterioration of the electronic element main body such as water content and oxygen from entering into the element, a function to make the electronic element main body and the like disposed on the substrate 11 insulative, or a function to solve bumps by the electronic element main body. The protective layer may be one layer, or plural layers may be stacked.

(Method for Manufacturing Electronic Device)

The method for manufacturing the electronic device 10 of the present invention is not specifically limited, and conventionally-known findings can be suitably referred to.

According to an exemplary embodiment of the present invention, a method for manufacturing an electronic device including the following steps is provided: (1) forming an electrode on a substrate, (2) preparing an electronic element main body on the substrate on which the electrode has been formed, (3) coating at least the electrode with a silicon-containing film, (4) forming bonding margins for bonding the substrate and a sealing substrate for sealing the electronic element main body on at least the silicon-containing film of the substrate and on the sealing substrate, respectively, and (5) bringing the bonding margins into contact and forming a bonding part by room-temperature bonding. Here, at least one of the substrate and the sealing substrate is a gas barrier film, and the silicon-containing film is a silicon-containing film having a composition represented by the above-mentioned chemical formula (1).

The method for manufacturing an electronic device according to the above-mentioned exemplary embodiment of the present invention will be explained, but the present invention is not limited to this at all.

(1) Step of Forming Electrode on Substrate

Firstly, an electrode (an extraction electrode) for controlling an electronic element main body is formed on a substrate. The method for forming the electrode is not specifically limited, and the electrode can be manufactured by suitably referring to a known technique. This extraction electrode may be formed by integrating simultaneously with the first electrode layer of the electronic element main body.

(2) Step of Preparing Electronic Element Main Body on Substrate on which Electrode has been Formed In the step of preparing an electronic element main body on the substrate, the formation is generally conducted by stacking, on the substrate, layers that constitute the electronic element main body such as a first electrode layer, a hole injection layer, a hole transport layer, a light-emitting layer, an electron transport layer, an electron injection layer and a second electrode layer in this order. The methods for forming these are not specifically limited, and these can be manufactured by suitably referring to known techniques.

Subsequently, where necessary, a protective layer is formed. The method for forming the protective layer is also not specifically limited, and the protective layer can be manufactured by suitably referring to a known technique.

(3) Step of Coating at Least Electrode with Silicon-Containing Film

Subsequently, a silicon-containing film is disposed on the surrounding of the position on which the electronic element main body is disposed, so as to coat at least the electrode. The silicon-containing film planarizes the unevenness on the substrate caused by the formation of the electrode, and forms the bonding part for sealing the electronic element main body.

At this time, it is sufficient that the silicon-containing film is prepared so as to coat at least the electrode, or may be formed so as to cover the whole surface of the electronic element main body.

Since the specific means for forming the silicon-containing film is similar to that mentioned above, the detailed explanation thereof is omitted herein.

(4) Step of Forming Bonding Margins for Bonding Substrate and Sealing Substrate for Sealing Electronic Element Main Body on at Least Silicon-Containing Film of Substrate and on Sealing Substrate, Respectively Subsequently, bonding margins for bonding the substrate and the sealing substrate are formed.

The room-temperature bonding device, which is used for respectively forming the bonding margins on the surface of the substrate and the surface of the sealing substrate, and for forming a bonding part by room-temperature bonding, which will be explained in the following step (3), will be explained below.

Figure 5:
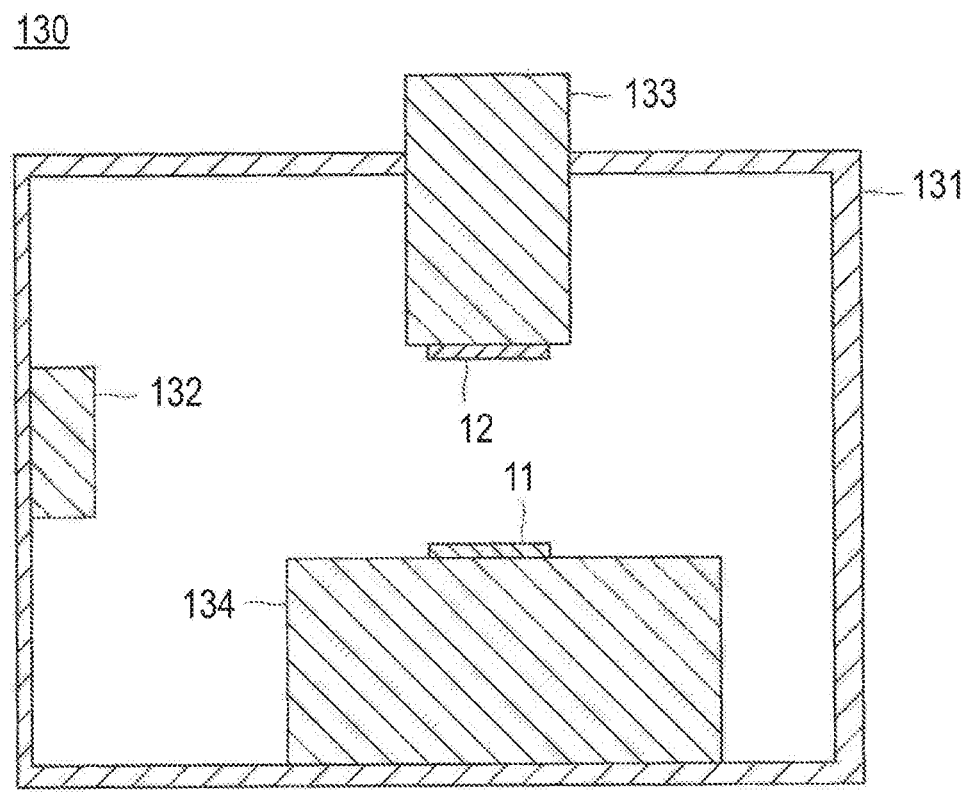
FIG. 5 is a cross-sectional schematic view showing an example of the room-temperature bonding device according to the present invention.

FIG. 5 is a cross-sectional schematic view showing an example of the room-temperature bonding device. A room-temperature bonding device 130 has a vacuum chamber 131, an ion gun (sputtering source) 132, a target stage 1 (133) and a target stage 2 (134).

The vacuum chamber 131 is a container for hermetically sealing the inside from environments, and further includes a vacuum pump (not illustrated) for ejecting a gas from the inside of the vacuum chamber 131, and a lid (not illustrated) for opening and closing a gate for connecting the inside and outside of the vacuum chamber 131. As the vacuum pump, a turbo molecular pump in which plural metal blades disposed therein flick gas molecules to thereby eject a gas is exemplified. The vacuum degree in the vacuum chamber 131 can be adjusted to be a predetermined vacuum degree by a vacuum pump.

The target stages 133 and 134 as metal release bodies are disposed so as to oppose. The respective opposing surfaces have dielectric layers. The target stage 133 applies a voltage to between the dielectric layer and the sealing substrate 12, and the sealing substrate 12 is adsorbed and fixed by the dielectric layer by an electrostatic force. Similarly, the target stage 134 adsorbs and fixes the substrate 11 via the dielectric layer.

The target stage 133 can be formed into a shape such as a columnar shape or a cubic shape, and can be transferred in parallel in the perpendicular direction with respect to the vacuum chamber 131. The parallel transfer is conducted by a pressure bonding mechanism (not illustrated) disposed on the target stage 133.

The target stage 134 can be transferred in parallel in the perpendicular direction with respect to the vacuum chamber 131, or can be rotated around a rotational axis that is in parallel to the perpendicular direction. The parallel transfer and rotation are conducted by a transfer mechanism (not illustrated) disposed on the target stage 134.

An ion gun (also referred to as "sputtering source") 132 is directed toward the substrate 11 and the sealing substrate 12. The ion gun 132 releases accelerated charged particles toward the direction to which the ion gun is directed. Examples of the charged particles include rare gas ions such as argon ion. Furthermore, in order to neutralize a subject that has been positively charged by the charged particles released by the ion gun 132, the vacuum chamber 131 may include an electron gun (not illustrated).

By undergoing the irradiation of the charged particles, the metal is released by sputtering from the target stages 133 and 134 in the device, whereby sputtering is conducted on the desired parts of the substrate 11 and the sealing substrate 12, and metal films are formed as bonding margins on the desired parts. The ranges of the desired parts can be determined by a known technique of metal masking, and for example, by subjecting the parts of the electronic element main body to metal masking (not illustrated) in sealing the electronic device of an exemplary embodiment of the present invention, a first bonding margin is formed on the surrounding part that has not been metal-masked on the substrate of the electronic element main body, and a second bonding margin is formed on the surrounding part that has not been metal-masked on the sealing substrate.

After the metal sputtering, the conditions for the irradiation of the charged particles are changed by adjusting the operation parameters of the ion gun 132 to thereby conduct the activation for bonding the respective bonding margins.

Figure 6:
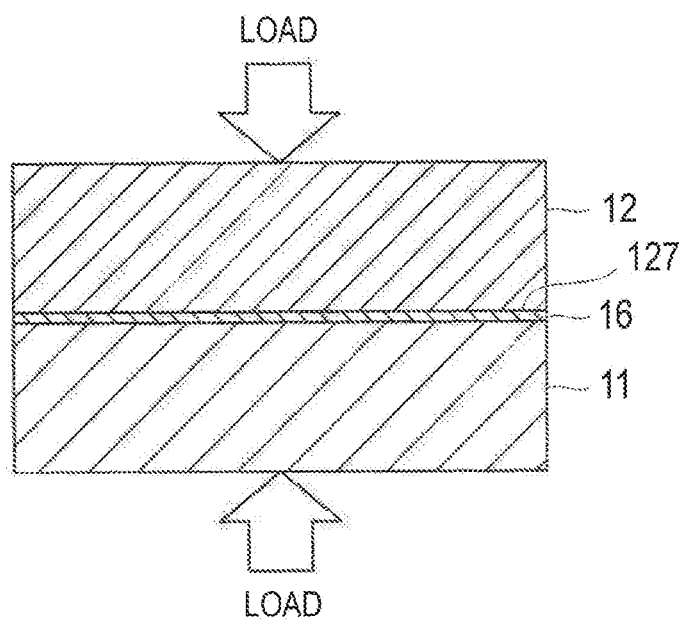
FIG. 6 is a cross-sectional schematic view showing a pressurized state for room-temperature bonding in the room-temperature bonding device according to the present invention.
Figure 7:
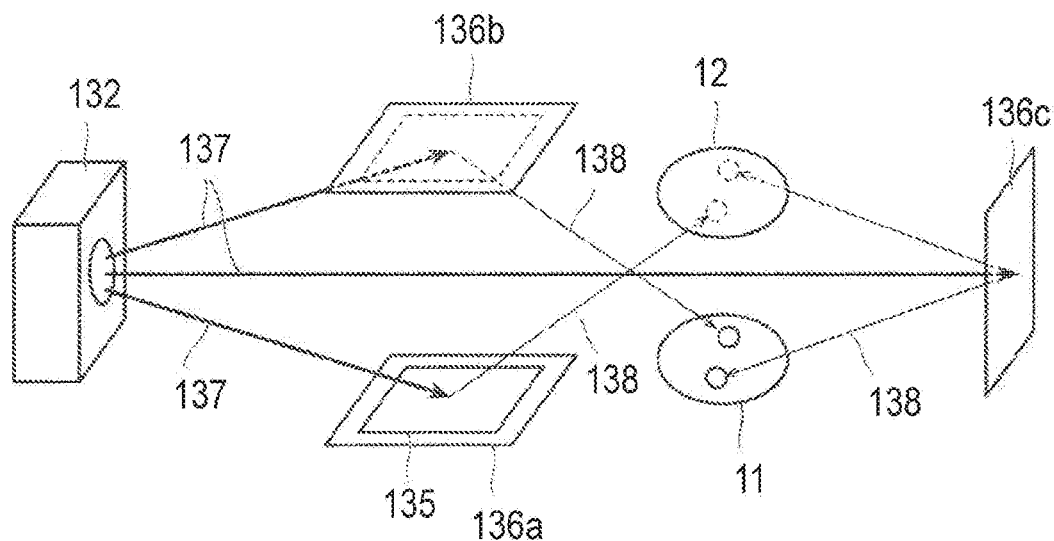
FIG. 7 is a perspective view showing a further example for the room-temperature bonding device according to the present invention.

Furthermore, the irradiation of the charged particles is completed, and the substrate 11 and the sealing substrate 12 are brought into contact as shown in FIG. 6 by allowing the target stage 133 to descent in the perpendicular direction by operating the pressure bonding mechanism of the target stage 1. By conducting room-temperature bonding in such way, the substrate 11 and the sealing substrate 12 are bonded at the first and second bonding margins, and a bonding part 16 is formed at an interface 127 of the substrate 11 and the sealing substrate 12. By this way, the electronic element main body can be sealed.

when a room-temperature bonding device 140 shown in FIG. 7 is used, plural metals can be sputtered simultaneously or continuously. For example, in the case when the bonding part in the present invention further contains silicon, the room-temperature bonding device 140 shown in FIG. 7 is used more preferably. The room-temperature bonding device 140 will be simply explained below.

The room-temperature bonding device 140 has the sputtering source 132, target substrates 136a, 136b and 136c, and a pressure bonding mechanism (not illustrated) for supporting the substrate 11 and the sealing substrate 12 in a vacuum chamber (not illustrated).

A metal target 135 that is intended to be sputtered is disposed in advance in the target substrates 136a, 136b and 136c. For example, in an exemplary embodiment of the present invention, a silicon target can be disposed as the metal target of the target substrates 136a, 136b and 136c.

The parts on which the respective bonding margins are to be formed are determined in advance by metal masking on the substrate 11 and sealing substrate 12 to be bonded, and the substrate 11 and sealing substrate 12 are fixed on a substrate holder (not illustrated) of the pressure bonding mechanism in the vacuum chamber. The fixing is not specifically limited, and the fixing can be conducted via an electrostatic layer in a similar manner to the case of the above-mentioned room-temperature bonding device 130.

Furthermore, since the vacuum chamber herein is similar to the vacuum chamber 131 of the room-temperature bonding device 130 mentioned above, the explanation thereof is omitted.

After the vacuum degree inside of the vacuum chamber can be adjusted to be a predetermined vacuum degree, the sputtering source 132 is started, and a rare gas ion beam (this is similar to "charged particles" as referred to in the above-mentioned room-temperature bonding device 130) of argon ion or the like can be entered (irradiated) into the target substrates 136a, 136b and 136c, the substrate 11 or the sealing substrate 12 like as in an incident ray 137. As a specific example, when an argon ion beam has entered into (irradiated) the silicon target that is disposed in the target substrate 136c, the silicon elements are launched, and the silicon elements reach and deposit on the bonding margin-forming parts of the above-mentioned substrate 11 and the sealing substrate 12 along an outgoing ray 138, whereby a silicon film can be formed. In addition, prior to the formation of the silicon film, it is preferable to conduct reverse sputtering as the cleaning of the surfaces of the respective bonding margin-forming parts by irradiating suitable argon ion beam, so as to remove the impurities, adsorbed gases, oxide films and the like adhered to the surfaces of the respective bonding margin-forming parts of the substrate 11 and the sealing substrate 12. The reverse sputtering refers to that a certain subject is irradiated with a certain energy ray to cause sputtering, whereby the irradiated part is physically scraped.

Thereafter, reverse sputtering is conducted as the activation of the metal films (bonding margins) formed on the substrate 11 and the sealing substrate 12 by using the argon ion beam that has not entered into the metal target. At this time, the activation by the reverse sputtering of the metal atoms may be conducted simultaneously with the deposition of the bonding margins. In addition, since the degrees of the effects of the above-mentioned deposition and activation depend on the disposition of the metal target, the intensity of the energy ray from the sputtering source 132, and the energy density distribution in the direction vertical to the incident ray 137, the degrees can be adjusted by presetting those. As a matter of course, adjustment by which an action of the reverse sputtering which goes beyond the deposition is caused is not adopted.

Furthermore, the metal mask is removed, and the pressure bonding mechanism is operated in a similar manner to that in the above-mentioned explanation of the room-temperature bonding device 130, whereby the bonding part 16 is formed. By this way, the electronic element main body can be sealed.

In the present invention, if unevenness is present on the bonding margin-forming parts, then the formed bonding margins are also affected, and the smoothness of the surfaces of the bonding margins decreases, and thus sufficient contact cannot be conducted and thus the bonding may become insufficient. Therefore, the surface having the electronic element main body and the surface of the sealing substrate of the above-mentioned substrate used can be planarized by conducting mirror surface polishing. Alternatively, for example, in the case when both of the substrate and sealing substrate are gas barrier films, it is also possible to conduct planarization by decreasing the viscosity of the application (i.e., decreasing the solid content concentration in the application liquid) in forming the gas barrier layers by the above-mentioned application process. Meanwhile, the surface center line average roughnesses (Ra) of the above-mentioned substrate surface and the above-mentioned sealing substrate before forming the respective bonding margins are each preferably 10 nm or less, more preferably 5 nm or less, further preferably 2 nm or less, specifically preferably 0.5 nm or less.

It is preferable to clean the respective bonding margin-forming parts before forming the bonding margins, from the viewpoint of removal of the impurities, adsorbed gases, oxide films and the like adhered to the surfaces. The cleaning and post-operations are preferably conducted in vacuum so that the sealed electronic device would not contain water content, oxygen and the like therein. The cleaning is preferably conducted under an environment of a vacuum degree of from $10^{-4}$ to $10^{-6}$ Pa.

Furthermore, the cleaning can be conducted by a known means, and examples include reverse sputtering, ion beam, ion beam sputtering and the like.

The reverse sputtering as an example for conducting the cleaning can be conducted as follows. The reverse sputtering can be conducted by using an inert gas such as argon and by irradiating at an acceleration voltage of from 0.1 to 10 kV, preferably from 0.5 to 5 kV, and at a current value of from 10 to 1,000 mA, preferably from 100 to 500 mA, for 1 to 30 minutes, preferably 1 to 5 minutes.

Thereafter, it is preferable that the above-mentioned first and second bonding margins are formed by sputtering. The sputtering herein includes sputtering by irradiation of ion beam, sputtering by irradiation of neutral particles beam, sputtering by irradiation of plasma, sputtering by irradiation of laser beam, and the like.

In the present invention, the metal target for the sputtering is not specifically limited, and from the viewpoint of improvement of the sealing property repetitive bending property, the metal target contains at least one kind selected from the group consisting of iron, cobalt, nickel, ruthenium, rhodium, palladium, osmium, iridium and platinum, preferably contains at least one kind selected from the group consisting of iron, cobalt and nickel.

Furthermore, in view of making the bonding property stronger, it is preferable to form a silicon film, an Al film or a Mo film or the like, more preferable to forma silicon film, on the respective bonding margin-forming parts of the substrate and the sealing substrate, before sputtering the metal target. The silicon film may be formed by sputtering a silicon target.

The sputtering of the silicon target can be conducted by irradiating under an environment of a vacuum degree of from $10^{-4}$ to $10^{-7}$ Pa, at an acceleration voltage of from 0.1 to 10 kV, preferably from 0.5 to 5.0 kV, and a current value of from 10 to 1,000 mA, preferably from 100 to 500 mA, for 1 to 30 minutes, preferably for 1 to 5 minutes.

Furthermore, the thicknesses of the silicon films formed on the parts for forming the first and second bonding margins are not specifically limited as long as the effect of the present invention is not deteriorated, and are each preferably from 1 to 100 nm, more preferably from 10 to 50 nm.

By this way, the bonding margins for bonding the substrate and the sealing substrate for sealing the electronic element main body can be formed on the substrate surface and the sealing substrate surface, respectively.

(5) Step of Bringing Bonding Margins into Contact and Forming Bonding Part by Room-Temperature Bonding In this step, the bonding margins formed in the step (4) are brought into contact, and bonded at an room temperature, whereby a bonding part is formed.

Before the contacting, it is preferable to activate the surfaces of the metal films on the respective bonding margins. The activation is conducted under a high vacuum environment of a vacuum degree of from $10^{-4}$ to $10^{-7}$ Pa, by using an ion beam of an inert gas such as argon, and can be conducted by irradiating at an acceleration voltage of from 0.1 to 10 kV, preferably from 0.5 to 5.0 kV, and a current value of from 10 to 1,000 mA, preferably from 100 to 500 mA, for 1 to 30 minutes, preferably for 1 to 5 minutes.

Secondly, the two metal masks are removed, and the activated first and second bonding margins can be bonded in vacuum at an room temperature without pressurization, and it is preferable to apply a pressure of 1 to 100 MPa within 1 to 10 minutes in view of conducting bonding more firmly.

Based on the steps (1) to (5) explained above, an electronic device in which an electronic element main body is sealed can be manufactured. Specifically, in the step (5), the surface layers of the metal films of the respective bonding margins are activated, and the atoms exposed on the surfaces are in the state that a part of the bonds that form chemical bonds have lost bonding pairs, and thus are expected to have a strong bonding force against the atoms on the metal film on the another bonding margin, and when the bonding margins are bonded, metal bonds are formed. The bonding part formed by such way does not have a bonding interface, and is a metal having metal bonds itself, and has a high sealing property (tight adhesiveness) and a high flexibility. That is, an electronic device that is excellent in sealing property, and also excellent in resistance to repetitive bending can be achieved.

Besides the above-mentioned manufacture method, a method for manufacturing an electronic device including the following steps is provided: (1) preparing an electronic element main body on a substrate, (2) forming an electrode on the substrate on which the electronic element main body has been prepared, (3) coating at least the electrode with a silicon-containing film, (4) forming bonding margins for bonding the substrate and a sealing substrate for sealing the electronic element main body on at least the silicon-containing film of the substrate and on the sealing substrate, respectively, and (5) bringing the bonding margins into contact and forming a bonding part by room-temperature bonding. The respective steps can be conducted in similar manners to those mentioned above.

Furthermore, a method for manufacturing an electronic device including the following steps is provided: (1) forming an electrode on a substrate, (2) coating at least the electrode with a silicon-containing film, (3) preparing an electronic element main body on the substrate, (4) forming bonding margins for bonding the substrate and a sealing substrate for sealing the electronic element main body on at least the silicon-containing film of the substrate and on the sealing substrate, respectively, and (5) bringing the bonding margins into contact and forming a bonding part by room-temperature bonding. The respective steps can be conducted in similar manners to those mentioned above.

Furthermore, a method including disposing an electronic element main body, an electrode and a silicon-containing film on a sealing member, and bonding these and a substrate by a similar method to that mentioned above can also be used.

EXAMPLES

The effect of the present invention will be explained by using the following Examples and Comparative Examples. However, the technical scope of the present invention is not limited to only the following Examples. Furthermore, in the Examples, an indication of "parts" or "%" is used, and the indication represents "parts by mass" or "% by mass" unless otherwise specified.

Example 1

Figure 8C:
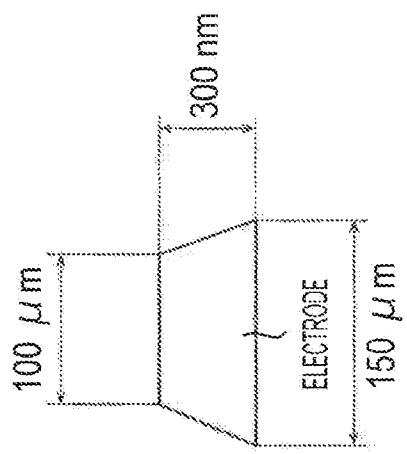
FIG. 8 is a view schematically showing the steps for the manufacture of the electronic device of the present invention.
Figure 8B:
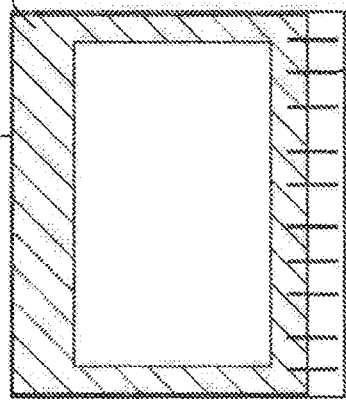
Figure 8A:
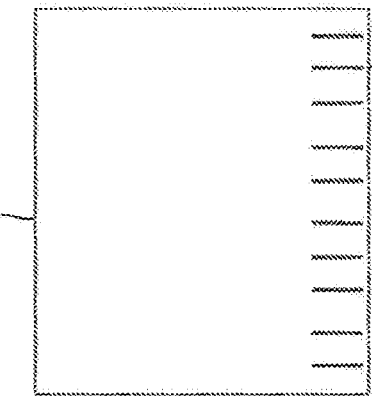

As shown in FIGS. 8A and 8C, indium tin oxide (ITO) was formed into a film by a sputtering process on a glass substrate (50 mm ×40 mm, thickness: 0.7 mm), and patterning was conducted by a photolithography process, whereby an electrode was disposed. Ten electrodes in total were disposed from one end of the glass substrate at a length of 10 mm. The height of each electrode was 300 nm, and the distance between the centers of the electrodes was 5 mm.

Using the parallel flat-plate capacitance bonding type PECVD device shown in FIG. 3, as shown in FIG. 8B, hexamethyldisiloxane, silane, oxygen, ammonia and trimethyl aluminum were fed onto the glass substrate on which the electrode had been disposed, and a silicon-containing film having the composition of Table 1 was formed at a thickness of 500 nm, whereby the unevenness of the electrode was planarized. The silicon-containing film was formed on the glass substrate with a width of 10 mm from the end, so that the area of 5 mm in the length of 10 mm of the electrode was coated by the silicon-containing film, as in FIG. 8B.

The film was formed under film formation conditions of the total flow amount of the hexamethyldisiloxane and silane gas of 50 sccm, the flow amount of the helium gas of 50 sccm, the inner pressure of the chamber of 10 Pa, the substrate temperature of 60° C., the RF power source electrical power of 500 W, and the RF power source frequency wave number of 13.56 MHz, by adjusting the film formation time so that the film thickness became 500 nm. At that time, the oxygen content of the silicon-containing film was adjusted according to the amount of the oxygen gas that was fed, and the nitrogen content was adjusted according to the amount of the ammonia that was fed. Furthermore, the carbon content was prepared according to the ratio of the hexamethyldisiloxane and silane gas that were fed. By this way, the silicon-containing films of samples 101 to 130 having the compositions of Table 1 were obtained.

<<Measurement of Composition of Silicon-Containing Film>>

The composition distributions of the silicon-containing films of samples 101 to 130, in which the electrode prepared above had been planarized, were measured by a method using XPS analysis under the following analysis conditions.

(Conditions for XPS Analysis)
Device: QUANTERASXM manufactured by ULVAC-PHI, Inc
X-ray source: monochromatic Al—Kα
Measured areas: Si2p, C1s, N1s, O1s
Sputter ion: Ar (2 keV)
After sputtering for 1 minute, measurements were repeated, and the composition was obtained from the average value in the thickness direction of the silicon-containing film.
Quantification: The background was obtained by the Shirley process, and the obtained peak surface area was quantified by using the relative sensitivity coefficient process. The data was processed by MultiPak manufactured by ULVAC-PHI, Inc.

<<Measurement of Elastic Modulus of Silicon-Containing Film>>

The elastic modulus of the silicon-containing film on the glass substrate by the nanoindentation process was measured by using a scanning probe microscope SPA400, Nano Navi II manufactured by SII Nanotechnology. For the measurement, a triangular pyramid diamond penetrator called as Cube corner Tip (tip edge angle: 90°) was used as a penetrator. The triangular pyramid diamond penetrator was vertically put on the surface of the sample, and a load was gradually applied until the maximum depth became 15 nm, and after the load reached the maximum load, the load was gradually returned to 0. The loading and unloading were both conducted in 5 seconds.

A nanoindentation elastic modulus (GPa) was calculated by using the following formula with deeming the gradient of an unloading curve as S (μN/nm).

$$\text{Nanoindentation elastic modulus (GPa)} = (S \times (\pi)^{1/2} / (2 \times (A)^{1/2})) \quad \text{[Mathematical Formula 1]}$$

In the formula, A (μm$^2$) represents a projected surface area of a penetrator contacting part, and π represents a circular constant.

The measurement was conducted after calibrating the device in advance so that the hardness obtained as a result of pressing the attached molten quartz as a standard sample into the device became 9.5±1.5 GPa.

[Preparation of Gas Barrier Film for Sealing]

A first barrier layer was formed on the surface of a PET film, Lumirror (registered trademark) U34 (thickness: 100 μm) manufactured by Toray Industries, Inc., by generating plasma by feeding an electrical power to opposed rolls and discharging by using the plasma CVD film formation device shown in FIG. 4, feeding a film formation gas (a mixed gas of hexamethyldisiloxane (HMDSO) as a raw material gas and oxygen gas (also functions as a discharging gas) as a reaction gas) to such discharging area, and conducting thin film formation by a plasma CVD process under the following conditions.

(Conditions for Film Formation)
Mixing ratio of film formation gas (hexamethyldisiloxane/oxygen): 100/1000 [unit: sccm (Standard Cubic Centimeter per Minute), 0° C., based on 1 atmospheric pressure]
Vacuum degree in vacuum chamber: 1.5 Pa
Applied electrical power from power source for generating plasma: 1 kW
Frequency number of power source for generating plasma: 80 kHz
Conveying velocity of film: 5 m/min
Film thickness of first barrier layer: 80 nm.

Subsequently, 0.5 g of aluminum ethyl acetoacetate diisopropylate was added to 10 g of a dibutyl ether solution containing 1% by mass of N,N,N',N'-tetramethyl-1,6-diaminohexane as an amine catalyst and 19% by mass of perhydropolysilazane (NAX120-20 manufactured by AZ Electronic Materials), and the mixture was stirred at 60° C. for 2 hours and allowed to cool, whereby a solution for forming a second barrier layer was prepared. Thereafter, the solution for forming a second barrier layer was applied by an extrusion process onto the first barrier layer prepared above, under an environment in the air at 23° C. and 50% RH so that the dry film thickness became 150 nm, dried at ambient temperature for 10 minutes, and irradiated with vacuum ultraviolet ray of 172 nm so as to give an integrated light amount of 2 J/cm$^2$ under a nitrogen atmosphere in which an oxygen concentration had been adjusted to be 0.1% by volume to 0.01% by volume on a hot plate at 80° C., whereby the second barrier layer was formed and a gas barrier film for sealing B-1 was obtained.

The water vapor transmittance of the gas barrier film for sealing B-1 was measured as a water vapor transmittance (WVTR) at 40° C. and 90% RH by using a film permeation evaluation device (API-BA90 manufactured by Nippon API Co., Ltd.), and found to be $3 \times 10^{-4}$ g/m$^2 \cdot$24 h.

Figure 8D:
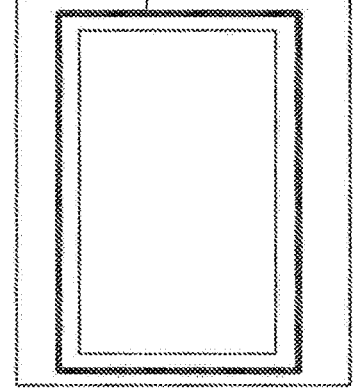
Figure 8E:
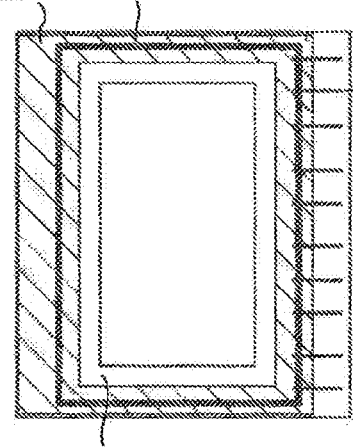

As an alternate of an OLED element, as shown in FIG. 8D, Ca was deposited by a deposition process in a rectangular shape of 40 mm ×25 mm at a thickness of 100 nm on the substrate prepared above, on which each of the electrodes of samples 101 to 130 prepared above and the silicon-containing film had been formed. Furthermore, the gas barrier film for sealing B-1 prepared above was cut into a size of 50 mm×35 mm, and used as a sealing substrate. These were disposed in a room-temperature bonding device as shown in FIG. 5, so that the side of the substrate on which Ca had been deposited and the side of the sealing substrate on which the barrier layer had been formed were opposed. Subsequently, metal masks for covering the part on which Ca is deposited, each having a slit for a bonding margin having a width of 0.4 mm were respectively disposed on both of the substrate and the sealing substrate on the areas of 2.0 mm from the ends of the substrates so as to surround the surrounding of Ca. The areas to be bonding margins of the substrate and the sealing substrate were respectively subjected to reverse sputtering under a vacuum of $1 \times 10^{-6}$ Pa by using an Ar ion gun to clean the surfaces. In the reverse sputtering, irradiation for 1 to 10 minutes was conducted at an acceleration voltage of from 0.1 to 2 kV and a current value of from 1 to 20 mA. By this way, the surfaces were activated. After the cleaning, according to the method described in JP 2008-62267 A, Si was sputtered at a thickness of 20 nm, and the top of the Si film was activated again by conducting reverse sputtering on the surface by using an Ar ion gun at an acceleration voltage of from 0.1 to 2 kV and a current value of from 1 to 20 mA. The sputtering of Si was conducted at an acceleration voltage of 1.5 kV and a current value of 100 mA for 3 minutes. Subsequently, the metal masks were removed, and the bonding margins of the substrate and the sealing substrate were then brought into contact at a vacuum degree of $1 \times 10^{-7}$ Pa, bonded by pressurizing at 20 MPa for 3 minutes, and the substrates were taken out in the air. In the obtained element, as shown in FIGS. 8D and 8E, the bonding part was formed from the parts of the bonding margins on both of the side of the substrate and the side of the sealing substrate.

<<Evaluation>>

(Evaluation of Sealing Property)

The simulated element prepared above was left under an environment of 85° C. and 85% RH for 500 hours, and the corrosion of metallic Ca was observed, and the sealing property was evaluated. The evaluation was conducted according to the following judgement criteria.

⊙: Ca did not corrode at all,

○: corrosion was present, but the surface area of the corroded part was less than 0.5% of the entirety, Δ: corrosion was present, but the surface area of the corroded part was 0.5% or more and less than 1.5% of the entirety, ×: corrosion was present, and the surface area of the corroded part was 1.5% or more of the entirety.

(Adhesive Force Test)

A peeling test was conducted from the side of the electrode side end part of the simulated element prepared above so as to give an angle of 90° with respect to the glass substrate. The evaluation was conducted according to the following judgement criteria.

⊙: the case when the gas barrier film was broken,

○: peeling occurred on 50% or more of the bonding surface of the film substrate of the gas barrier film B-1, Δ: the peeling force during the peeling was 5 N/inch or more, ×: the peeling force during the peeling was less than 5 N/inch.

The above-mentioned results are shown in the following Table 1.

TABLE 1

| | Silicon-containing film (1) SiO$_x$N$_y$C$_z$ | | | | Elastic modulus (GPa) | Element | | Composition of chemical formula (1) |
|---|---|---|---|---|---|---|---|---|
| Sample | x | y | z | 2x + 5y | | Sealing property | Adhesive force | Present invention/Comparison |
| 101 | 1 | 0.75 | 0 | 5.75 | 55 | X | X | Comparison | — |
| 102 | 0.5 | 0.75 | 0 | 4.75 | 48 | X | X | Comparison | — |
| 103 | 0 | 0.75 | 0 | 3.75 | 42 | X | X | Comparison | — |
| 104 | 1 | 0.65 | 0 | 5.25 | 52 | Δ | X | Comparison | — |
| 105 | 0.5 | 0.65 | 0 | 4.25 | 35 | ⊙ | ○ | Present invention | Composition 2 |
| 106 | 0 | 0.65 | 0 | 3.25 | 32 | Δ | ○ | Present invention | Composition 2 |
| 107 | 1 | 0.55 | 0 | 4.75 | 38 | ⊙ | ○ | Present invention | Composition 2 |
| 108 | 0.5 | 0.55 | 0 | 3.75 | 28 | ○ | ⊙ | Present invention | Composition 2 |
| 109 | 0.5 | 0.55 | 0.1 | 3.75 | 25 | ○ | ⊙ | Present invention | Composition 2 |
| 110 | 0 | 0.55 | 0 | 2.75 | 15 | X | Δ | Comparison | — |
| 111 | 2 | 0.35 | 0 | 5.75 | 53 | Δ | X | Comparison | — |
| 112 | 1 | 0.35 | 0 | 3.75 | 31 | ○ | ⊙ | Present invention | Composition 2 |
| 113 | 0.5 | 0.35 | 0 | 2.75 | 16 | X | Δ | Comparison | — |
| 114 | 2 | 0.25 | 0 | 5.25 | 45 | X | X | Comparison | — |
| 115 | 2 | 0.25 | 0.1 | 5.25 | 43 | Δ | X | Comparison | — |
| 116 | 1.7 | 0.25 | 0 | 4.65 | 44 | ○ | X | Comparison | — |
| 117 | 1.7 | 0.25 | 0.1 | 4.65 | 39 | ○ | ⊙ | Present invention | Composition 1 |
| 118 | 1 | 0.25 | 0 | 3.25 | 42 | Δ | X | Comparison | — |
| 119 | 1 | 0.25 | 0.1 | 3.25 | 36 | Δ | ○ | Present invention | Composition 1 |
| 120 | 0.5 | 0.25 | 0.1 | 2.25 | 18 | X | ○ | Comparison | — |
| 121 | 2 | 0.1 | 0 | 4.5 | 42 | Δ | X | Comparison | — |
| 122 | 2 | 0.1 | 0.1 | 4.5 | 37 | ⊙ | ⊙ | Present invention | Composition 1 |
| 123 | 1 | 0.1 | 0 | 2.5 | 19 | X | ○ | Comparison | — |
| 124 | 1 | 0.1 | 0.1 | 2.5 | 18 | X | Δ | Comparison | — |
| 125 | 2 | 0 | 0 | 4 | 45 | Δ | X | Comparison | — |

TABLE 1-continued

| | Silicon-containing film (1) $SiO_xN_yC_z$ | | | | Elastic modulus (GPa) | Element | | | Composition of chemical formula (1) |
|---|---|---|---|---|---|---|---|---|---|
| Sample | x | y | z | 2x + 5y | | Sealing property | Adhesive force | Present invention/Comparison | |
| 126 | 2 | 0 | 0.005 | 4 | 42 | Δ | X | Comparison | — |
| 127 | 2 | 0 | 0.015 | 4 | 38 | ○ | ○ | Present invention | Composition 1 |
| 128 | 2 | 0 | 0.1 | 4 | 33 | ⊙ | ⊙ | Present invention | Composition 1 |
| 129 | 2 | 0 | 0.8 | 4 | 24 | ○ | Δ | Present invention | Composition 1 |
| 130 | 2 | 0 | 1.2 | 4 | 18 | X | Δ | Comparison | — |

It was clarified from the results in the above-mentioned Table 1 that an electrode become possible to be sealed by room-temperature bonding by coating the electrode with a silicon-containing film having a specific composition, and an element prepared by this way can provide excellent sealing property and adhesiveness.

Specifically, among the silicon-containing films satisfying the composition of the chemical formula (1), in the case of composition 2 in which the atomic ratio y of nitrogen to silicon is 0.3 or more, in the compositions in which the value of 2x+5y was relatively high as 3.5 or more, specifically 4 or more as in samples 105 and 107, the sealing property tended to be fine. Furthermore, the adhesive force tended to be specifically fine in the compositions wherein the value of 2x+5y was around 3.5 to 4 as in samples 108, 109 and 112. Furthermore, in the case of composition 1 in which the atomic ratio y of nitrogen to silicon is less than 0.3, in the compositions of samples 122 and 128 in which the atomic ratio y of nitrogen was 0.1 or less and the atomic ratio z of carbon was more than 0.05 and less than 0.20, the sealing property was specifically fine. Furthermore, in the compositions of samples 117, 122 and 128 in which the atomic ratio z of carbon to silicon was more than 0.05 and less than 0.20, the adhesive force was specifically fine.

Example 2

(Preparation of Sample 201)

A substrate was prepared, and an electrode was prepared on the substrate, in a similar manner to the above-mentioned Example 1.

Thereafter, a silicon-containing film was disposed on the electrode by the following method.

According to the method described in JP 2012-164543 A, under a nitrogen atmosphere, NAX120-20 manufactured by AZ Electronic Materials, which is a dibutyl ether solution containing 1% by mass of N,N,N',N'-tetramethyl-1,6-diaminohexane as an amine catalyst and 19% by mass of perhydropolysilazane, was applied onto the part for disposing a silicon-containing film of FIG. 8B by an inkjet process so that the dry film thickness became 500 nm, dried under a nitrogen flow at 80° C. for 5 minutes, treated at 85° C. and 85% RH for 1 hour, and subjected to a modification treatment in a dry oven at 90° C. for 3 hours, whereby a silicon-containing film was obtained.

Ca was then deposited in a similar manner to Example 1 onto the substrate on which the electrode and the silicon-containing film had been formed, and the substrate and the gas barrier film B-1 were bonded to give sample 201.

(Preparation of Sample 202)

Sample 202 was obtained by preparing a simulated element in a similar procedure to that for sample 201, except that a silicon-containing film was disposed on an electrode by the following method.

According to the method described in JP 2007-59131 A, under a nitrogen atmosphere, NAX120-20 manufactured by AZ Electronic Materials, which is a dibutyl ether solution containing 1% by mass of N,N,N',N'-tetramethyl-1,6-diaminohexane as an amine catalyst and 19% by mass of perhydropolysilazane, was applied onto the part for disposing a silicon-containing film of FIG. 8B by an inkjet process so that the dry film thickness became 500 nm, dried under air at 80° C. for 5 minutes, and subjected to a modification treatment under air at 90° C. by heating for 1 hours, whereby a silicon-containing film was obtained.

(Preparation of Sample 203)

Sample 203 was obtained by preparing a simulated element in a similar procedure to that for sample 201, except that a silicon-containing film was disposed on an electrode by the following method.

NAX120-20 manufactured by AZ Electronic Materials, which is dibutyl ether solution containing 1% by mass of N,N,N',N'-tetramethyl-1,6-diaminohexane as an amine catalyst and 19% by mass of perhydropolysilazane, was applied onto the part for disposing a silicon-containing film of FIG. 8B by a screen printing process under an environment in the air, at 23° C. and a relative humidity of 50% RH so that the dry film thickness became 500 nm, dried at ambient temperature for 10 minutes, and subjected to a modification treatment by irradiating with vacuum ultraviolet ray of 172 nm so as to give an integrated light amount of 2 J/cm² under a nitrogen atmosphere in which the oxygen concentration has been adjusted to from 0.1% by volume to 0.01% by volume on a hot plate of 80° C., whereby a silicon-containing film was obtained.

(Preparation of Sample 204)

Sample 204 was obtained by preparing a simulated element in a similar procedure to that for sample 201, except that a silicon-containing film was disposed on an electrode by the following method.

Under a nitrogen atmosphere, NAX120-20 manufactured by AZ Electronic Materials, which is a dibutyl ether solution containing 1% by mass of N,N,N',N'-tetramethyl-1,6-diaminohexane as an amine catalyst and 19% by mass of perhydropolysilazane, was applied onto the part for disposing a silicon-containing film of FIG. 8B by an inkjet process under an environment in the air, at 23° C. and a relative humidity of 50% RH so that the dry film thickness became 500 nm, dried at ambient temperature for 10 minutes, and subjected to a modification treatment by irradiating with vacuum ultraviolet ray of 172 nm so as to give an integrated light amount of 10 J/cm² under a nitrogen atmosphere in which the oxygen concentration has been adjusted to 0.2% by volume on a hot plate of 80° C., whereby a silicon-containing film was obtained.

(Preparation of Sample 205)

Sample 205 was obtained by preparing a simulated element in a similar procedure to that for sample 201, except that a silicon-containing film was disposed on an electrode by the following method.

Under a nitrogen atmosphere, aluminum ethyl acetoacetate-diisopropylate (AlCH) (0.5 g) was added to NAX120-20 manufactured by AZ Electronic Materials (10 g), which is a dibutyl ether solution containing 1% by mass of N,N,N',N'-tetramethyl-1,6-diaminohexane as an amine catalyst and 19% by mass of perhydropolysilazane, and stirring was conducted at 60° C. for 2 hours, and the product was allowed to cool. Thereafter the solution was applied by an inkjet method onto the part for disposing a silicon-containing film of FIG. 8B under an environment in the air, at 23° C. and a relative humidity of 50% RH so that the dry film thickness became 500 nm, and subjected to a modification treatment by irradiating with vacuum ultraviolet ray of 172 nm so as to give an integrated light amount of 2 J/cm$^2$ under a nitrogen atmosphere on a hot plate of 90° C., whereby a silicon-containing film was obtained.

(Preparation of Sample 206)

Sample 206 was obtained by preparing a simulated element in a similar procedure to that for sample 201, except that a silicon-containing film was disposed on an electrode by the following method.

Application was conducted by a similar method to that of sample 205, a modification treatment was conducted by the following oxygen plasma treatment instead of conducting the modification treatment by a vacuum ultraviolet light.

(Plasma Ion Injection Device)
RF power source: Model No. "RF" 56000 manufactured by JEOL Ltd.
High voltage pulse power source: "PV-3-HSHV-0835" manufactured by Kurita
(Conditions for Plasma Ion Injection)
Plasma generating gas: Ar
Gas flow amount: 100 sccm
Duty ratio: 0.5%
Applied voltage: −6 kV
RF power source: frequency number 13.56 MHz, applied electrical power 1000 W
Chamber inner pressure: 0.2 Pa
Pulse width: 5 μsec
Treatment time (ion injection time): 200 seconds.

The ratio of the infrared absorption intensity of Si—H against the infrared absorption intensity of Si—O of each of the silicon-containing films of samples 201 to 206 prepared above was measured by the following method.

<<Infrared Absorption of Silicon-Containing Film>>

Using FT/IR-4200 manufactured by JASCO Corporation, the ratio of the absorption of Si—H around 2210 cm$^{-1}$ against the absorption of Si—O around 1080 cm$^{-1}$ was obtained by an ATR process using Ge.

Furthermore, the silicon-containing film and simulated element were evaluated by similar methods to those in Example 1, whereby the results in Table 2 were obtained.

TABLE 2

| | | | Silicon-containing film (1) $SiO_xN_yC_z$ or (2) $SiO_xN_yC_zM_w$ | | | | | | | | | |
|---|---|---|---|---|---|---|---|---|---|---|---|---|
| Sample | Polysilazane compound | Modification treatment | x | y | z | 2x + 5y | w | Elastic modulus (GPa) | Si—H/Si—O | Sealing property | Adhesive force | Present invention/ Comparison | Chemical formula/ Composition |
| 201 | PHPS | Heat | 2.1 | 0.02 | 0 | 4.30 | 0 | 48 | 0 | Δ | X | Comparison | — |
| 202 | PHPS | Heat | 2.2 | 0 | 0 | 4.40 | 0 | 52 | 0 | Δ | X | Comparison | — |
| 203 | PHPS | Excimer | 0.6 | 0.6 | 0 | 4.20 | 0 | 25 | 0.6 | ⊙ | ○ | Present invention | (1) Composition 2 |
| 204 | PHPS | Excimer | 1.0 | 0.6 | 0 | 5.00 | 0 | 35 | 0.05 | ○ | ⊙ | Present invention | (1) Composition 2 |
| 205 | PHPS + AlCH | Excimer | 2.0 | 0.02 | 0.13 | 4.10 | 0.10 | 35 | 0 | ⊙ | ⊙ | Present invention | (2) |
| 206 | PHPS + AlCH | Oxygen plasma | 2.0 | 0.02 | 0.1 | 4.10 | 0.10 | 35 | 0 | ○ | ○ | Present invention | (2) |

It was clarified from the results in the above-mentioned Table 2 that it becomes possible to seal an electrode by room-temperature bonding by coating the electrode with a silicon-containing film having a specific composition, and the element prepared by this way can provide excellent sealing property and adhesiveness.

Specifically, among the silicon-containing films having the composition of the chemical formula (1), in the case of composition 2 in which the atomic ratio y of nitrogen to silicon is 0.3 or more, the composition having a value of 2x+5y of 3.5 or more and 4.5 or less as in sample 203 tended to have an especially file sealing property. Furthermore, it was found that, in the silicon-containing film that satisfies the chemical formula (2), specifically in the case when the modification treatment was conducted by excimer as in sample 205, an element having excellent sealing property and adhesiveness can be obtained.

Example 3

<<Preparation of Electronic Device>>

An organic EL element as an electronic device was prepared by the following method instead of the simulated elements of Examples 1 and 2.

[Preparation of Organic EL Element]

(Formation of First Electrode Layer)

A film of ITO (indium tin oxide) having a thickness of 150 nm was formed by a sputtering process on a substrate, which was formed by lining alkali-free glass with a thickness of 40 μm with a PET substrate, and the film was heated at 120° C. for 10 minutes to form a transparent electroconductive film. Patterning was conducted on this transparent electroconductive film by a photolithography process to thereby form a first electrode layer.

(Formation of Hole Transport Layer)

The application liquid for forming a hole transport layer shown below was applied by an extrusion applicator onto the first electrode layer formed above so that the thickness after drying became 50 nm, and then dried, whereby a hole transport layer was formed.

Before applying the application liquid for forming a hole transport layer, a washing surface modification treatment of the gas barrier film was conducted by using a low pressure mercury lamp with a wavelength of 184.9 nm at an irradiation intensity of 15 mW/cm² and a distance of 10 mm. A charge elimination treatment was conducted by using a static eliminator by a weak X-ray.

<Conditions for Application>

The application step was conducted under an environment in the air, at 25° C. and a relative humidity of 50% RH.

<Preparation of Application Liquid for Formation of Hole Transport Layer>

A solution obtained by diluting polyethylenedioxythiophene-polystyrene sulfonate (PEDOT/PSS, Baytron (registered trademark) P AI 4083 manufactured by Bayer) with pure water to 65%, and diluting with methanol to 5% was prepared as an application liquid for forming a hole transport layer.

<Conditions for Drying and Thermal Treatments>

The application liquid for forming a hole transport layer was applied, and the solvents were removed by blowing the film-formed surface with hot air at a height of 100 mm, an ejection wind velocity of 1 m/s, a transversal wind velocity distribution of 5% and a temperature of 100° C. Subsequently, a thermal treatment of a rear-surface heat transfer system was conducted by using a thermal treatment device at a temperature of 150° C., whereby a hole transport layer was formed.

(Formation of Light-Emitting Layer)

An application liquid for forming a white light-emitting layer shown below was applied by an extrusion applicator onto the hole transport layer formed above so that the thickness after the drying became 40 nm, and dried, whereby a light-emitting layer was formed.

<Application Liquid for Forming White Light-Emitting Layer>

An application liquid for forming a white light-emitting layer was prepared by dissolving 1.0 g of a host material H-A, 100 mg of a dopant material D-A, 0.2 mg of a dopant material D-B and 0.2 mg of a dopant material D-C in 100 g of toluene. The chemical structures of the host material H-A, the dopant material D-A, the dopant material D-B and the dopant material D-C are as shown in the following chemical formulas.

[Chemical Formula 10]

H-A

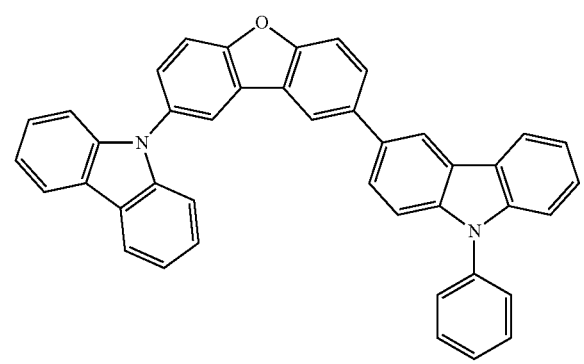

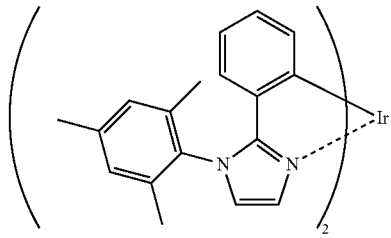

D-A

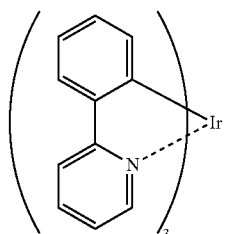

D-B

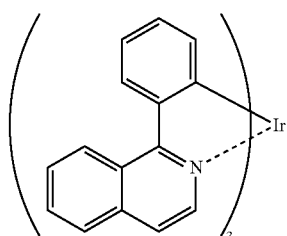

D-C

<Conditions for Application>

The application step was conducted under an atmosphere of a nitrogen gas concentration of 99% or more at an application temperature of 25° C., at an application velocity of 1 m/min.

<Conditions for Drying and Thermal Treatments>

The application liquid for forming a white light-emitting layer was applied, and the solvents were removed at a height of 100 mm, an ejection wind velocity of 1 m/s, a transversal wind velocity distribution of 5% and a temperature of 60° C. toward the film-formed surface. Subsequently, a thermal treatment was conducted at a temperature of 130° C., whereby a light-emitting layer was formed.

(Formation of Electron Transport Layer)

The application liquid for forming an electron transport layer shown below was applied by an applicator onto the light-emitting layer formed above so that the thickness after the drying became 30 nm, and dried, whereby an electron transport layer was formed.

<Conditions for Application>

The application step was conducted under an atmosphere of a nitrogen gas concentration of 99% or more, at an application temperature of the application liquid for forming an electron transport layer of 25° C., and at an application velocity of 1 m/min.

<Application Liquid for Forming Electron Transport Layer>

For the electron transport layer, an application liquid for forming an electron transport layer was prepared by dissolving E-A (see the following chemical formula) in 2,2,3,3-tetrafluoro-1-propanol to give a 0.5% by mass solution.

[Chemical Formula 11]

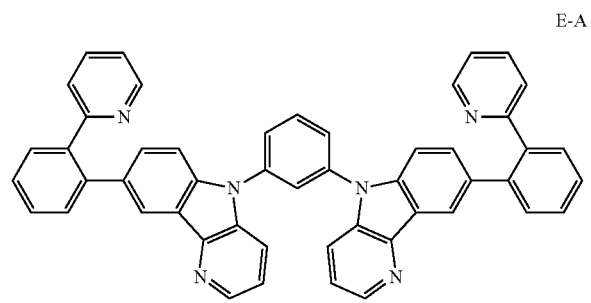

E-A

<Conditions for Drying and Thermal Treatments>

The application liquid for forming an electron transport layer was applied, and the solvent was removed by blowing the film-formed surface with hot air at a height of 100 mm, an ejection wind velocity of 1 m/s, a transversal wind velocity distribution of 5% and a temperature of 60° C. Subsequently, a thermal treatment was conducted on a thermal treatment part at a temperature of 200° C., whereby an electron transport layer was formed.

(Formation of Electron Injection Layer)

An electron injection layer was formed on the electron transport layer formed above. Firstly, the substrate was put into a pressure reduction chamber, and the pressure was reduced to $5 \times 10^{-4}$ Pa. Cesium fluoride, which had been prepared in a deposition boat made of tantalum in a vacuum chamber in advance, was heated, whereby an electron injection layer having a thickness of 3 nm was formed.

(Formation of Second Electrode Layer)

A second electrode layer having a thickness of 100 nm was stacked on the electron injection layer formed above, by conducting mask pattern film formation by a deposition process under a vacuum of $5 \times 10^{-4}$ Pa so as to have an extraction electrode, which is formed of aluminum as a material for forming the second electrode layer.

(Formation of Extraction Electrode)

For each of the first electrode and second electrode, an extraction electrode was prepared by molybdenum (50 nm)/aluminum (200 nm)/molybdenum (50 nm). The detailed shape was prepared by a similar shape to that of FIG. 8C.

(Formation of Protective Layer)

Subsequently, a protective layer was formed on the second electrode layer by stacking $SiO_2$ at a thickness of 200 nm by a CVD process except for the parts that become the extraction parts of the first electrode and second electrode.

By this way, an electronic element main body was prepared.

(Formation of Silicon-Containing Film)

The silicon-containing films of samples 301 to 306 were prepared by similar formulations to those of samples 201 to 206 prepared in Example 2 on the outer periphery parts of the substrates on which the electronic element main bodies had been disposed. The silicon-containing films were each formed at a distance of 1.0 mm from the end part of the electronic element main body and at a width of 0.2 mm so as to surround the periphery of the electronic element main body.

[Preparation of Gas Barrier Film for Sealing]

A gas barrier film B-2 was prepared in a similar manner to that of Example 1, except that a Zeonoa film ZF-14 manufactured by Zeon Corporation, which is a cycloolefin polymer, which was lined with 75 μm of a PET heat-resistance protective film, was used as the substrate for a gas barrier film. The water vapor transmittance (WVTR) of the obtained gas barrier film was measured by a similar method to that of Example 1, and found to be $4 \times 10^{-4}$ g/m²·day.

Organic EL elements 301 to 306 were prepared in a similar manner to that of Example 2, except that gas barrier film B-2 was used as the sealing substrate.

Furthermore, an organic EL element 307 was prepared in a similar manner to that for the organic EL element 301 except that the silicon-containing film was not formed, but was not be able to be bonded with the gas barrier film B-2 by room-temperature bonding.

<<Evaluation of Organic EL Element>>

For the organic EL elements prepared above, the durability was evaluated according to the following method.

(Measurement of Dark Spot)

Each of the organic EL elements 301 to 306 prepared above was subjected to an accelerated deterioration treatment for 250 hours under an environment at 85° C. and 85% RH. An electrical current of 1 mA/cm² was applied onto each organic EL element, and the dark spot (DS) when a light-emitting image was photographed was calculated as a surface area ratio. The evaluation was conducted by the following judgement criteria.

⊚: DS do not occur at all,

○: DS is present, and the surface area of the DS part is 0.2% or less,

Δ: DS is present, and the surface area of the DS part is more than 0.2% and 0.5% or less, ×: DS is present, and the surface area of the DS part is more than 0.5% and or less 1.0%.

(Measurement of Dark Spot after Bending Deterioration Treatment)

A cycle in which each of the organic EL elements prepared above was wound around a column of 50 mmφ over 1 second and then extended to a plane for 1 second was repeated 100,000 times, and the organic EL element was then subjected to an accelerated deterioration treatment under an environment of 85° C. and 85% RH for 250 hours, and the surface area of the dark spot was measured by a similar method to that mentioned above. The evaluation was conducted by similar judgement criteria to those for the measurement of the dark spot mentioned above.

The results are shown in Table 3.

TABLE 3

| | | Element | | |
|---|---|---|---|---|
| Sample | Silicon-containing film formulation | Initial DS | DS after bending | |
| 301 | 201 | Δ | X | Comparison |
| 302 | 202 | Δ | X | Comparison |
| 303 | 203 | ⊚ | ○ | Present invention |
| 304 | 204 | ⊚ | ⊚ | Present invention |
| 305 | 205 | ⊚ | ⊚ | Present invention |
| 306 | 206 | ○ | ○ | Present invention |
| 307 | None | Not bonded | | Comparison |

It was clarified from the results of the above-mentioned Table 3 that it becomes possible to seal an electrode by room-temperature bonding by coating the electrode with a silicon-containing film having a specific composition, and the organic EL element prepared by this way can provide excellent sealing property and resistance against bending.

Example 4

Samples 401 to 406 were prepared under similar conditions to those for sample 305 in Example 3, except that the film thickness of the silicon-containing film on the substrate was changed as in the following Table 4, and similar evaluations to those in Example 3 were conducted. The results are shown in the following Table 4.

TABLE 4

| | Silicon-containing film | | Element | | |
|---|---|---|---|---|---|
| Sample | Thickness (nm) | Thickness of silicon-containing film/thickness of electrode | Initial DS | DS after bending | |
| 401 | 80 | 0.26 | Δ | Δ | Present invention |
| 402 | 150 | 0.5 | ○ | ○ | Present invention |
| 403 | 250 | 0.83 | ⊙ | ⊙ | Present invention |
| 404 | 500 | 1.66 | ⊙ | ⊙ | Present invention |
| 405 | 2000 | 6.66 | ⊙ | ○ | Present invention |
| 406 | 12000 | 40 | ○ | Δ | Present invention |

As shown in the above-mentioned Table 4, an element having a higher sealing property can be obtained when the film thickness of the silicon-containing film is ⅓ or more of the thickness of the electrode.

Example 5

An organic solar battery (OPV) layer formed of the following formulation was stacked on the gas barrier film B-1 prepared in Example 1.

<<Preparation of Optelectronic Conversion Element (Solar Battery)>>

An indium tin oxide (ITO) transparent electroconductive film as a first electrode (anode) was deposited on the barrier layer side of the gas barrier film B-1 at a thickness of 150 nm (sheet resistance: 12 Ω/square) was patterned in 10 mm width by using a general photolithography process and a wet etching to form a first electrode. The patterned first electrode was washed by ultrasonic washing with a surfactant and ultrapure water and ultrasonic washing by ultrapure water in this order, dried by blowing with nitrogen, and finally subjected to ultraviolet ozone washing. Subsequently, as a hole transport layer, an isopropanol solution containing 2.0% by mass of PEDOT-PSS (CLEVIOS (registered trademark) P VP AI 4083, manufactured by Heleos, electroconductivity: $1\times10^{-3}$ S/cm) formed of an electroconductive polymer and a polyanion was prepared, and the solution was applied and dried so that the dried film thickness became about 30 nm by using a blade coater with a substrate adjusted to 65° C. Thereafter, a thermal treatment was conducted by hot air of 120° C. for 20 seconds, whereby a hole transport layer was formed on the above-mentioned first electrode. The hole transport layer and first electrode were brought into a glove box, and the subsequent operations were conducted under a nitrogen atmosphere.

Firstly, the element on which up to the above-mentioned hole transport layer had been formed was subjected to a thermal treatment at 120° C. for 3 minutes under a nitrogen atmosphere.

Subsequently, an organic optelectronic conversion material composition solution was prepared by mixing o-dichlorobenzene with 0.8% by mass of the following compound A as a p-type organic semiconductor material, and 1.6% by mass of an n-type organic semiconductor material, PC60BM (nanom (registered trademark) Spectra E100H manufactured by Frontier Carbon Corporation (p-type organic semiconductor material:n-type organic semiconductor material=33:67 (mass ratio)). The solution was completely dissolved by stirring with heating to 100° C. on a hot plate (60 minutes), applied by using a blade coater with a substrate adjusted to 40° C. so that the dry film thickness became about 170 nm, and dried at 120° C. for 2 minutes, whereby an optelectronic conversion layer was formed on the above-mentioned hole transport layer.

[Chemical Formula 12]

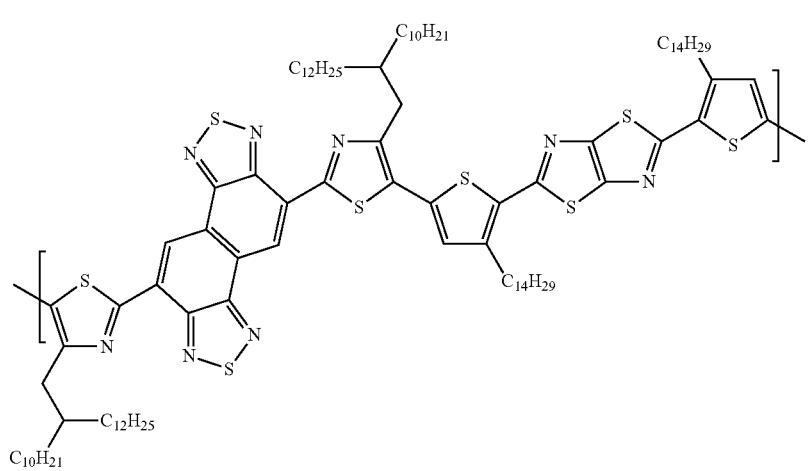

Compound A

[Chemical Formula 13]

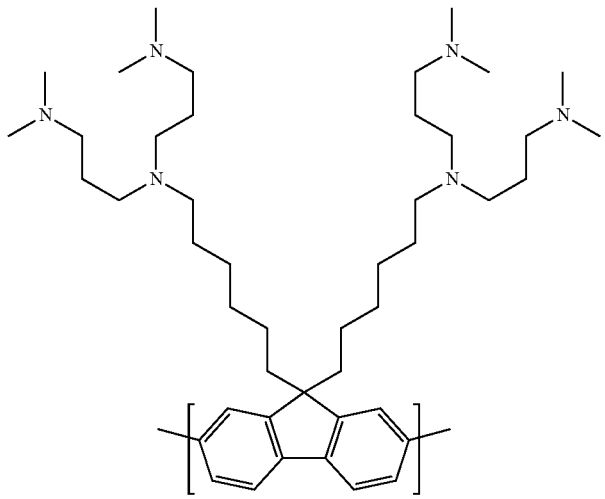

Compound B

Subsequently, the above-mentioned compound B was dissolved in a mixed solvent of 1-butanol:hexafluoroisopropanol=1:1 so as to have a concentration of 0.02% by mass to thereby prepare a solution. This solution was applied and dried by using a blade coater with a substrate adjusted to 65° C. so that the dry film thickness became about 5 nm. Thereafter a heating treatment was conducted with hot air of 100° C. for 2 minutes, whereby an electron transport layer was formed on the above-mentioned optelectronic conversion layer.

Subsequently, the element on which the above-mentioned electron transport layer had been formed was disposed in a vacuum deposition device. Furthermore, the element was set so that a shadow mask with a width of 10 mm was orthogonal to the transparent electrode, and the pressure in the vacuum deposition device was reduced to $10^{-3}$ Pa or less, and 100 nm of silver was deposited at a deposition velocity of 2 nm/sec, whereby a second electrode (a cathode) was formed on the above-mentioned electron transport layer.

(Formation of Extraction Electrode)

For each of the first electrode and second electrode, an extraction electrode was prepared with molybdenum (50 nm)/aluminum (200 nm)/molybdenum (50 nm). The detailed shape was prepared in a similar shape as in FIG. 8C.

(Formation of Protective Layer)

Subsequently, a protective layer was formed on the second electrode layer by stacking $SiO_2$ at a thickness of 200 nm by a CVD process except for the parts that become the extraction parts of the first electrode and second electrode.

By this way, an electronic element main body was prepared.

[Sealing]

Samples 501 to 504 were prepared by conducting sealing by the following procedure.

(Sample 501)

The substrate on which the electronic element main body on which the protective layer had been formed prepared above had been formed, and the gas barrier film B-1, which is a sealing substrate prepared by a similar procedure to that of Example 1, were subjected to an adhesion-curing treatment by using a sheet-like adhesive TB-1655 manufactured by ThreeBond Holdings Co., Ltd., whereby sealing was conducted.

(Sample 502)

A silicon-containing film (thickness: 500 nm) was formed on the electronic element main body on which the protective layer had been formed prepared above under similar conditions to that for sample 205 of Example 2 so as to cover the whole surface of the electronic element main body. Thereafter, under a vacuum of $1\times10^{-6}$ Pa, the whole surface of the silicon-containing film on the electronic element main body, and the whole surface of the side on which the gas barrier layer had been formed of the gas barrier film B-1 as a sealing substrate were washed by an Ar ion gun, and room-temperature bonding was then immediately conducted at a strength of 20 MPa for 3 minutes without conducting sputtering of Si metal, and the electronic element main body was subsequently taken out in the air.

(Sample 503)

A silicon-containing film (thickness: 500 nm) was formed on the electronic element main body on which the protective layer had been formed, which was prepared above, under similar conditions to those for sample 205 of Example 2, so as to cover the whole surface of the electronic element main body. Subsequently, under a vacuum of $1\times10^{-6}$ Pa, the whole surface of the silicon-containing film on the electronic element main body, and the whole surface of the side on which the gas barrier layer had been formed of the gas barrier film B-1 as a sealing substrate were washed by an Ar ion gun, and Si metal was stacked at a thickness of 20 nm by conducting sputtering under a vacuum of $1\times10^{-6}$ Pa. Thereafter washing was conducted again by an Ar ion gun under a vacuum of $1\times10^{-6}$ Pa, and room-temperature bonding was then immediately conducted at a strength of 20 MPa for 3 minutes, and the electronic element main body was subsequently taken out in the air.

(Sample 504)

A solution for preparing a silicon-containing film was applied by an inkjet process onto the periphery of the electronic element main body, on the substrate on which the electronic element main body on which the protective layer had been formed has been formed, which was prepared above, by a similar means to that for sample 205 of Example 2, and a modification treatment was conducted in a similar manner to give a silicon-containing film. The silicon-containing film was formed so as to surround the periphery of the electronic element main body at a distance of 1.0 mm from the end part of the electronic element main body and at a width of 0.2 mm. Subsequently, bonding was conducted on only the periphery part of the electronic element main body in a similar manner to that of Example 1.

<<Evaluation of Optelectronic Conversion Element (Solar Battery)>>

For the optelectronic conversion element (solar battery) prepared above, the durability was evaluated according to the following method.

<Measurement of Short-Circuit Current Density, Open Voltage, Fill Factor, and Optelectronic Conversion Efficiency>

The prepared organic optelectronic conversion element was irradiated with light having an intensity of 100 mW/cm² by using a solar simulator (AM1.5G filter), a mask having an effective surface area of 1 cm² was superposed on a light receiving part, and IV properties were evaluated, whereby the short-circuit current density Jsc (mA/cm²), open voltage Voc (V) and fill factor FF were measured, and the initial optelectronic conversion efficiency (%) was calculated by the following formula.

$$\eta[\%] = J_{sc}[mA/cm^2] \times V_{oc}[V] \times FF[\%] / \text{Incident light intensity } [mW/cm^2] \quad \text{[Mathematical Formula 2]}$$

Subsequently, the power generation efficiency after the deterioration treatment was measured under the following conditions.

(Heat-Moisture Treatment)

The optelectronic conversion element was left under an environment at 85° C. and 85% RH for 500 hours, and the optelectronic conversion efficiency was measured.

(Bending Treatment)

The optelectronic conversion element was wound around a column of 50 mmϕ over 1 second and then extended to a plane for 1 second, and this cycle was repeated 100,000 times, and the organic EL element was then subjected to an accelerated deterioration treatment under an environment of 85° C. and 85% RH for 10 hours, and the optelectronic conversion efficiency was then measured.

The results of the evaluation are shown in the following Table 5.

TABLE 5

| | Sealing method | Optelectronic conversion efficiency (%) After heat-moisture treatment | Optelectronic conversion efficiency (%) After bending treatment | |
|---|---|---|---|---|
| 501 | Adhesive (without silicon-containing film) | 5.20 | 1.20 | Comparison |
| 502 | Room-temperature bonding (whole surface, silicon-containing film) | 5.25 | 4.30 | Present Invention |
| 503 | Room-temperature bonding (whole surface, silicon-containing film + Si) | 5.30 | 5.30 | Present Invention |
| 504 | Room-temperature bonding (periphery part, silicon-containing film + Si) | 5.30 | 5.25 | Present Invention |

As is apparent from the above-mentioned Table 5, the deterioration of the performance is small and the stability is excellent even after the heat-moisture treatment and after the bending treatment in the elements of the present invention, as compared to the element of sample 501, which was sealed by using an adhesive.

The present application is based on the Japanese Patent Application No. 2013-156146 filed on Jul. 26, 2013, and the entirety of the contents of the disclosure is herein incorporated by reference.

The invention claimed is:

1. An electronic device comprising:
a substrate;
an electronic element main body on the substrate;
an electrode that is connected to the electronic element main body;
a silicon-containing film that coats at least the electrode; and
a sealing substrate that is bonded to the substrate via a bonding part that has the silicon-containing film and is disposed on the surrounding of the electronic element main body, to seal the electronic element main body,
wherein at least one of the substrate and the sealing substrate is a gas barrier film, and
the silicon-containing film has a composition represented by the following chemical formula (1):

[Chemical Formula 1]

$$SiO_xN_yC_z \quad (1)$$

wherein x, y and z are respectively atomic ratios of oxygen, nitrogen and carbon to silicon, and satisfy 0≤y<0.3, 3<2x+5y≤5 and 0.01<z<1, or satisfy 0.3≤y<0.7, 3<2x+5y≤5 and 0≤z<1.

2. The electronic device according to claim 1, wherein the silicon-containing film further contains an element M selected from the elements of Group 13 of the Long Format Periodic Table, and has a composition represented by the following chemical formula (2):

[Chemical Formula 2]

$$SiO_xN_yC_zM_w \quad (2)$$

wherein x, y, z and w are respectively atomic ratios of oxygen, nitrogen, carbon and M to silicon, and satisfy 0≤y<0.3, 3<2x+5y≤5, 0.01<z<1 and 0.01<w<0.5.

3. The electronic device according to claim 1, wherein the silicon-containing film is formed by modifying a layer containing a polysilazane compound.

4. The electronic device according to claim 1, wherein the silicon-containing film has an elastic modulus of the film measured by the nanoindentation process of from 20 to 40 GPa.

5. A method for manufacturing an electronic device, comprising:
a step of forming an electrode on a substrate;
a step of preparing an electronic element main body on the substrate on which the electrode has been formed;
a step of coating at least the electrode with a silicon-containing film;
a step of forming bonding margins for bonding the substrate and a sealing substrate for sealing the electronic element main body, on at least the silicon-containing film of the substrate, and on the sealing substrate, respectively; and
a step of bringing the bonding margins into contact and forming a bonding part by room-temperature bonding,
wherein at least one of the substrate and the sealing substrate is a gas barrier film, and the silicon-containing film has a composition represented by the following chemical formula (1):

[Chemical Formula 3]

$$SiO_xN_yC_z \quad (1)$$

wherein x, y and z are respectively atomic ratios of oxygen, nitrogen and carbon to silicon, and satisfy $0 \leq y < 0.3$, $3 < 2x+5y \leq 5$ and $0.01 < z < 1$, or satisfy $0.3 \leq y < 0.7$, $3 < 2x+5y \leq 5$ and $0 \leq z < 1$.

6. The electronic device according to claim 2, wherein the silicon-containing film is formed by modifying a layer containing a polysilazane compound.

7. The electronic device according to claim 2, wherein the silicon-containing film has an elastic modulus of the film measured by the nanoindentation process of from 20 to 40 GPa.

8. The electronic device according to claim 3, wherein the silicon-containing film has an elastic modulus of the film measured by the nanoindentation process of from 20 to 40 GPa.

* * * * *